(12) United States Patent
Quick et al.

(10) Patent No.: US 8,912,549 B2
(45) Date of Patent: Dec. 16, 2014

(54) OPTICAL DEVICE AND METHOD OF MAKING

(75) Inventors: Nathaniel R. Quick, Lake Mary, FL (US); Aravinda Kar, Oviedo, FL (US); Islam A. Salama, Chandler, AZ (US)

(73) Assignee: University of Central Florida, Orlando, FL (US), part interest ( * ) Notice: Subject to any disclaimer, the term of this patent is extended or adjusted under 35 U.S.C. 154(b) by 832 days.

(21) Appl. No.: 13/068,129

(22) Filed: May 3, 2011

(65) Prior Publication Data

US 2011/0211249 A1 Sep. 1, 2011

Related U.S. Application Data

(62) Division of application No. 11/340,883, filed on Jan. 26, 2006, now Pat. No. 7,951,632.

(60) Provisional application No. 60/647,678, filed on Jan. 26, 2005.

(51) Int. Cl.
| | |
|---|---|
| H01L 21/322 | (2006.01) |
| H01L 31/0312 | (2006.01) |
| H01L 31/0352 | (2006.01) |
| G01J 5/08 | (2006.01) |
| G01K 11/12 | (2006.01) |
| H01L 21/268 | (2006.01) |
| G01J 5/58 | (2006.01) |

(52) U.S. Cl.
CPC .............. *H01L 21/268* (2013.01); *G01J 5/0809* (2013.01); *G01J 5/08* (2013.01); *G01K 11/125* (2013.01); *G01J 5/58* (2013.01)
USPC .............................................. 257/77; 257/432

(58) Field of Classification Search
USPC .............. 438/46, 93, 796; 257/432, E31.046, 257/E33.068, E33.073, E21.065, 77
See application file for complete search history.

(56) References Cited

U.S. PATENT DOCUMENTS

| 3,214,315 A | 10/1965 | Hildebrand |
| 3,396,401 A | 8/1968 | Nonomura |

(Continued)

FOREIGN PATENT DOCUMENTS

| JP | 358095830 A | 6/1983 |
| JP | 405024975 A | 2/1993 |

(Continued)

OTHER PUBLICATIONS

Sugioka, K., et al, "Direct Formation of Three-Dimensional Structures in GaAs by Excimer Laser Doping", Jap. J. Appl. Phys., vol. 28, No. 10, Oct. 1989, pp. 2162-2166.*

(Continued)

*Primary Examiner* — George Fourson, III
(74) *Attorney, Agent, or Firm* — Frijouf, Rust & Pyle P.A.

(57) ABSTRACT

An optical device and method is disclosed for forming the optical device within the wide-bandgap semiconductor substrate. The optical device is formed by directing a thermal energy beam onto a selected portion of the wide-bandgap semiconductor substrate for changing an optical property of the selected portion to form the optical device in the wide-bandgap semiconductor substrate. The thermal energy beam defines the optical and physical properties of the optical device. The optical device may take the form of an electro-optical device with the addition of electrodes located on the wide-bandgap semiconductor substrate in proximity to the optical device for changing the optical property of the optical device upon a change of a voltage applied to the optional electrodes. The invention is also incorporated into a method of using the optical device for remotely sensing temperature, pressure and/or chemical composition.

10 Claims, 17 Drawing Sheets

(56) References Cited

U.S. PATENT DOCUMENTS

| | | | |
|---|---|---|---|
| 3,419,321 A | 12/1968 | Barber et al. | |
| 3,605,469 A | 9/1971 | Queralto | |
| 3,788,120 A | 1/1974 | Takeo et al. | |
| 3,854,123 A | 12/1974 | Banach | |
| 3,865,564 A | 2/1975 | Jaeger et al. | |
| 3,874,240 A | 4/1975 | Rembaum | |
| 3,943,324 A | 3/1976 | Haggerty | |
| 3,944,640 A | 3/1976 | Haggerty et al. | |
| 3,945,318 A | 3/1976 | Landsman | |
| 3,965,328 A | 6/1976 | Locke | |
| 3,981,705 A | 9/1976 | Jaeger et al. | |
| 4,043,170 A | 8/1977 | Erodi et al. | |
| 4,135,902 A | 1/1979 | Oehrle | |
| 4,142,088 A | 2/1979 | Hirsch | |
| 4,159,414 A | 6/1979 | Suh et al. | |
| 4,215,263 A | 7/1980 | Grey et al. | |
| 4,309,224 A | 1/1982 | Shibata | |
| 4,339,285 A | 7/1982 | Pankove | |
| 4,372,989 A | 2/1983 | Menzel | |
| 4,383,843 A | 5/1983 | Iyengar | |
| 4,496,607 A | 1/1985 | Mathias | |
| 4,539,251 A | 9/1985 | Sugisawa et al. | |
| 4,547,650 A | 10/1985 | Arditty et al. | |
| 4,565,712 A | 1/1986 | Noguchi et al. | |
| 4,620,264 A | 10/1986 | Ushifusa et al. | |
| 4,624,934 A | 11/1986 | Kokubu et al. | |
| 4,663,826 A | 5/1987 | Baeuerle | |
| 4,691,091 A | 9/1987 | Lyons et al. | |
| 4,710,253 A | 12/1987 | Soszek | |
| 4,761,339 A | 8/1988 | Komatsu et al. | |
| 4,791,239 A | 12/1988 | Shirahata et al. | |
| 4,840,853 A | 6/1989 | Lio et al. | |
| 4,847,138 A | 7/1989 | Boylan et al. | |
| 4,860,442 A | 8/1989 | Ainsworth et al. | |
| 4,872,923 A | 10/1989 | Borodin | |
| 4,880,770 A | 11/1989 | Mir et al. | |
| 4,901,550 A | 2/1990 | Kolde | |
| 4,912,087 A | 3/1990 | Aslam et al. | |
| 4,924,033 A | 5/1990 | Iyogi et al. | |
| 4,950,558 A | 8/1990 | Sarin | |
| 4,962,085 A | 10/1990 | deBarbadillo, II et al. | |
| 4,988,564 A | 1/1991 | D'Angelo et al. | |
| 5,015,618 A | 5/1991 | Levinson | |
| 5,055,967 A | 10/1991 | Sukonnik et al. | |
| 5,127,364 A | 7/1992 | Savkar et al. | |
| 5,145,741 A * | 9/1992 | Quick | 428/402 |
| 5,149,681 A | 9/1992 | Ohkawa et al. | |
| 5,180,440 A | 1/1993 | Siegel et al. | |
| 5,336,360 A | 8/1994 | Nordine | |
| 5,391,841 A | 2/1995 | Quick | |
| 5,405,481 A | 4/1995 | Licoppe et al. | |
| 5,416,342 A | 5/1995 | Edmond et al. | |
| 5,459,098 A | 10/1995 | Maya | |
| 5,493,096 A | 2/1996 | Koh | |
| 5,549,971 A | 8/1996 | Nordine | |
| 5,629,532 A | 5/1997 | Myrick | |
| 5,680,200 A | 10/1997 | Sugaya et al. | |
| 5,695,828 A | 12/1997 | Ghosh et al. | |
| 5,733,609 A | 3/1998 | Wang | |
| 5,754,299 A | 5/1998 | Sugaya et al. | |
| 5,793,042 A | 8/1998 | Quick | |
| 5,823,039 A | 10/1998 | Umeda et al. | |
| 5,837,607 A | 11/1998 | Quick | |
| 5,847,418 A | 12/1998 | Nakamura et al. | |
| 5,889,234 A | 3/1999 | Ghosh et al. | |
| 5,906,708 A | 5/1999 | Robinson et al. | |
| 5,961,877 A | 10/1999 | Robinson et al. | |
| 6,025,609 A | 2/2000 | Quick | |
| 6,054,375 A * | 4/2000 | Quick | 438/535 |
| 6,064,081 A | 5/2000 | Robinson et al. | |
| 6,203,861 B1 | 3/2001 | Kar et al. | |
| 6,221,154 B1 | 4/2001 | Lee et al. | |
| 6,252,197 B1 | 6/2001 | Hoekstra et al. | |
| 6,255,671 B1 | 7/2001 | Bojarczuk et al. | |
| 6,271,576 B1 * | 8/2001 | Quick | 257/588 |
| 6,274,234 B1 | 8/2001 | Dujardin et al. | |
| 6,313,015 B1 | 11/2001 | Lee et al. | |
| 6,334,939 B1 | 1/2002 | Zhou et al. | |
| 6,407,443 B2 | 6/2002 | Chen et al. | |
| 6,526,327 B2 | 2/2003 | Kar et al. | |
| 6,621,448 B1 | 9/2003 | Lasky et al. | |
| 6,627,964 B2 * | 9/2003 | Nakashima et al. | 257/414 |
| 6,670,693 B1 | 12/2003 | Quick | |
| 6,732,562 B2 | 5/2004 | Quick et al. | |
| 6,900,465 B2 | 5/2005 | Nakamura et al. | |
| 6,930,009 B1 | 8/2005 | Quick | |
| 6,939,748 B1 * | 9/2005 | Quick | 438/142 |
| 6,998,690 B2 | 2/2006 | Nakamura et al. | |
| 7,045,375 B1 | 5/2006 | Wu et al. | |
| 7,237,422 B2 | 7/2007 | Quick | |
| 7,268,063 B1 | 9/2007 | Quick | |
| 7,419,887 B1 | 9/2008 | Quick | |
| 2013/0175546 A1 * | 7/2013 | Khan, Adam | 257/77 |

FOREIGN PATENT DOCUMENTS

| | | |
|---|---|---|
| WO | WO 03013757 | 2/2000 |
| WO | WO 03013757 | 2/2003 |

OTHER PUBLICATIONS

Nathaniel R. Quick, Laser Conversion of Ceramic Materials to Electroconductors, International Conference on Electronic Materials-1990, Materials Research Society, Newark, New Jersey, Sep. 17-19, 1990.

Nathaniel R. Quick, Direct Conversion of Conductors on Ceramic Substrates, International Society for Hybrid Microelectronics, ISHM 90 Proceedings 1990.

Nathaniel R. Quick and Jeffrey A. Phillips, Laser Processes for Integrating Substrate Fabrication, Proceedings of the International Conference on Lasers '91, The Society for Optical & Quantum Electronics, pp. 537-544 San Diego, CA Dec. Sep. 13, 1991.

Nathaniel R. Quick and Richard J. Matson, Characterization of a Ceramic Electrical Conductor Synthesized by a Laser Conversion Process, Proceedings of the International Conference on Lasers '91, The Society for Optical & Quantum Electronics, pp. 545-552 San Diego, CA Dec. 9-13, 1991.

Nathaniel R. Quick, Characterization of a Ceramic Sensor Synthesized by a Laser Conversion Process, Proceedings of the International Conference on Lasers '92, The Society for Optical & Quantum Electronics, pp. 881-887 Houston, Texas Dec. 7-10, 1992.

Nathaniel R. Quick, Characterization of a Ceramic Thermal Sensor Synthesized by a Laser Conversion Process, ICALEO '92 (International Congress on Applications of Lasers and Electra-Optics), vol. 75 Laser Materials Processing, Laser Institute of America, pp. 394-404 Oct. 25-29, 1992.

D K. Sensupta, N. R. Quick and A. Kar, Laser Direct Write of Conducting and Insulating Tracks in Silicon Carbide, Materials Research Society Symposium Proceedings vol. 624 pp. 127-133 2000.

D. K. Sengupta, N. R. Quick and A. Kar, Laser Conversion of Electrical Properties fo Silicon Carbide Device Applications, Journal of Laser Applications., 2001, vol. 13, pp. 26-31.

I.A. Salama, N.R. Quick and A. Kar, Laser Doping of Silicon Carbide Substrates, Journal of Electronic Materials, vol. 31, 2002, pp. 200-208.

I.A. Salama, N. R. Quick and A. Kar, Microstructural and electrical resistance analysis of laser-processed SiC substrates for wide bandgap semiconductor materials, Journal of Materials Science, vol. 40, 2005, pp. 3969-3980.

I.A. Salama, N. R. Quick and A. Kar, Laser Synthesis of Carbon-Rich Sic Nanoribbons, Journal of Applied Physics, vol. 93, 2003, pp. 9275-9281.

I.A. Salama., N.R. Quick, and A. Kar, Laser Direct Write Doping of Wide-Bandgap Semiconductor Materials,IEEE ISCS 2003 Proceedings.

A. Salama, C. F. Middleton, N. R. Quick G. D. Boreman and A. Kar, Laser-Metallized Silicon Carbide Schottky Diodes for Millimeter Wave Detection and Frequency Mixing, Symposium N1 Nitride and

(56) References Cited

OTHER PUBLICATIONS

Wide Bandgap Semiconductors for Sensors, Photonics and Electronics IV, 204th Meeting of the Electrochemical Society, Orlando, Florida Oct. 12-18, 2003.

A. Salama, N. R. Quick and A. Kar, Laser Direct Metallization of Silicon Carbide without Metal Deposition, Symposium C, New Applications for Wide Bandgap Semiconductors, Materials Research Society, Apr. 23-24, 2003.

I. A. Salama, N. R. Quick and A. Kar, Laser-induced Dopant Incorporation in Wide Bandgap Materials: SiC and GaN, ICALEO 2003 (International Congress On Applications of Lasers and Electro-Optics) Proceedings, 2003.

I.A. Salama, N.R. Quick, and A. Kar, Laser Direct Writing and Doping of Diamond-like Carbon, Polycrystalline Diamond and Single Crystal Silicon Carbide, Journal of Laser Applications. vol. 16, 2004, pp. 92-99.

Z. Tian, N. R. Quick and A. Kar, Laser Direct Write and Gas Immersion Laser Doping Fabrication of SiC Diodes, J: Silicon Carbide Materials, Procesing and Devices, Symposium J Apr. 14-15, 2004.

Z. Tian, N. R. Quick and A. KAr, Laser Doping of Silicon Catbon and PIN Diode Fabrication, 23rd International Congress on Applications of Lasers & Electro-Optics 2004.

A. Kar and N. R. Quick, Laser Processing for Wide Bandgap Semiconductor Device Fabrication, 2004 Meeting of Optical Society of America, 2004.

Z. Tian, I.A. Salama, N. R. Quick and A. Kar, Effects of Different laser Sources and Doping Methods used to Dope Silicon Carbide, Acta Materialia, vol. 53, 2005, pp. 2935-2844.

I.A. Salama, N. R. Quick and A. Kar, Microstructural and electrical resistance analysis of laser-processed SiC substrates for wide bandgap semiconductor materials, Journal of Materials Science, vol. 40; 2005, pp. 3969-3980.

Z. Tian, N. R. Quick and A. Kar Characteristics off 6H-Silicon Carbide PIN Diodes Prototyping by Laser Doping, Journal of Electronic Materials, vol. 34, 2005, pp. 430-438.

Chong Zhang, A. Salama, N. R. Quick and A. Kar, Two-Dimensional Transient Modeling of CO2 Laser Drilling of Microvias in High Density Flip Chip Substrates, ICALEO 2005 (International Congress on Applications of Lasers and Electro-Optics), Laser Institute of America, Oct. 31-Nov. 3, 2005.

Chong Zhang, S. Bet, A. Salama, N. R. Quick and A. Kar, CO2 Laser Drilling of Microvias Using Diffractive Optics Techniques. I Mathematical Modeling, InterPack 05, The ASME/Pacific Rim Technical Conference on integration and Packaging of MEMS. NEMS and Electronic Systems, San Francisco, CA Jul. 17-22, 2005.

Z. Tian, N. R. Quick and A. Kar, Laser Synthesis of Optical Structures in Silicon Carbide, 207th Meeting of the Electrochemical Society Proceedings, May 15-20, 2005.

Z. Tian, N.R. Quick and A. Kar, Laser-enhanced diffusion of nitrogen and aluminum dopants in silicon carbide, Acta Materiallia, vol. 54, pp. 4273-4283.

Z. Tian, N.R. Quick and A. Kar,Laser Direct Write Doping and Metallization Fabrication of Silicon Carbide PIN Diodes, Materials Science Forum, vols. 527-529, 2006, pp. 823-826.

S. Dakshnamurthy, N.R. Quick and A. Kar, Sic-based Optical Interferometry at high pressures and temperatures for pressure and chemical sensing, Journal of Applied Physics; vol. 99, 2006, pp. 094902-1 to 094902-8.

C. Zhang, A. Salama, N. R. Quick and A. Kar, Modelling of Microvia Drilling with a Nd:YAG Laser, Journal of Physics D: Applied Physics 39 (2006) 3910-3918.

Z. Tian, N. R. Quick and A. Kar, Laser Endotaxy and PIN Diode Fabrication of Silicon Carbide, 2006 Spring Meting of Materials Research Society, 2006.

Z. Tian, N. R. Quick and A. Kar, Characteristics of Laser-Fabricated Diodes on Endotaxial Silicon Carbide Substrates, ESCRM (European Conference on Silicon Carbide and Related Materials) Proceedings 2006.

S. Bet, N.R. Quick and A. Kar, Laser Doping of Chromium and Selenium in p-type 4H-SiC, ICSCRM 2007 Symposium.

N. Quick, S. Bet and A. Kar, Laser Doping Fabrication of Energy Conversion Devices Materials Science and Technology 2007 Conference and Exhibition.

S. Bet, N.R. Quick and A. Kar, Effect of Laser Field and Thermal Stress on Diffusion in Laser Doping of SiC, Acta Materialia 55 (2007) 6816-6824.

S. Bet, N.R. Quick and A. Kar, Laser-Doping of Silicon Carbide for p-n Junction and LED Fabrication, Physica Status Solidi (A), vol. 204, No. 4, 2007, pp. 1147-1157.

S. Dakshinamurthy, N.R. Quick and A. Kar, Temperature-dependent Optical Properties of Silicon Carbide for Wireless Temperature Sensors, Journal of PhysicsD: Applied Physics 40 (2007)353-360.

S. Dakshinamurthy, N.R. Quick and A. Kar, High temperature optical properties of silicon carbide for wireless thermal sensing, Journal of Physics D: Applied Physics, vol. 40. No. 2. 2007, pp. 353-360.

Chong Zhang, A. Salama, N. R. Quick and A. Kar, Determination of Thermaphysical Properties for Polymer Films using Conduction Analysis of Laser Heating, International Journal of Thermophysics, vol. 28, No. 3, Jun. 2007.

N. R. Quick, S. Bet and A. Kar, Laser Doping Fabrication of Energy Conversion Devices, Materials Science and Technology 2007 Conference and Exhibition, Sep. 19, 2007.

S. Bet, N.R. Quick and A. Kar, Laser Doping of Chromium in 6H-SiC for White Light Emittng Diodes, Laser Institute of America, Journal of Laser Applications Vo. 20 No. 1 pp. 43-49 Feb. 2008.

Z. Tian, N. R. Quick and A. Kar, Laser Endotaxy in Silicon Carbide and PIN Diode Fabrication, Laser institute of America, Journal of Laser Applications, vol. 20 No. 2 pp. 100-115, May 2008.

I. Salama, N. Quick and A. Kar, Laser Direct Write Doping of Wide-Bandgap Semiconductor Materials, ISCS 2003 Proceedings ,2003.

I. Salama, N. Quick and A. Kar, Laser Microprocessing of Wide Bandgap Materials, Proceedings of International Congress on Laser Advanced Materials Processing (LAMP 2002).

S. Bet, N. Quick and A. Kar, Laser Doping of Chromium and Selenium in P-Type 4H-SiC, Materials Science Forum vols. 600-603 (2009) pp. 627-630.

Wai Lek Ng, et al, Nature, vol. 410, Issue 8 (2001)].

S.E. Vlaskina, Silicon Carbide LED, Semiconductor Physics, Quantum Electronics & Optoeloctronics , 2002, vol. 5. No. 1, pp. 71-75, b) S. Kamiyama et al.

Extremely high quantum efficiency of donor-acceptor-pair emission in N-and B-doped 6H-SiC, JAP, 99,093 10 (2006).].

Effects of Different Laser Sources and doping methods [Z. Tian., N. R. Quick, and A. Kar, Acta Materialia, vol. 53, (2005), pp. 2835-2844.

[Laser Enhanced Diffusion of Nitrogen and Aluminum Z. Tian, N. R. Quick and A. Kar, Acta Materialia, 54, 4273, (2006)].

* cited by examiner

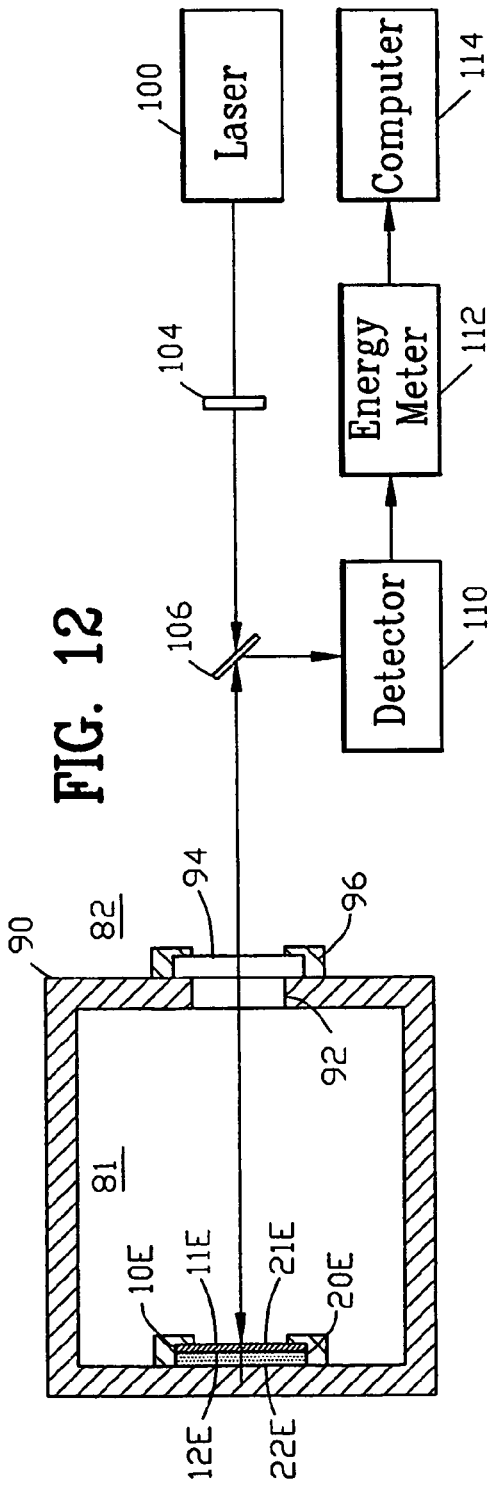
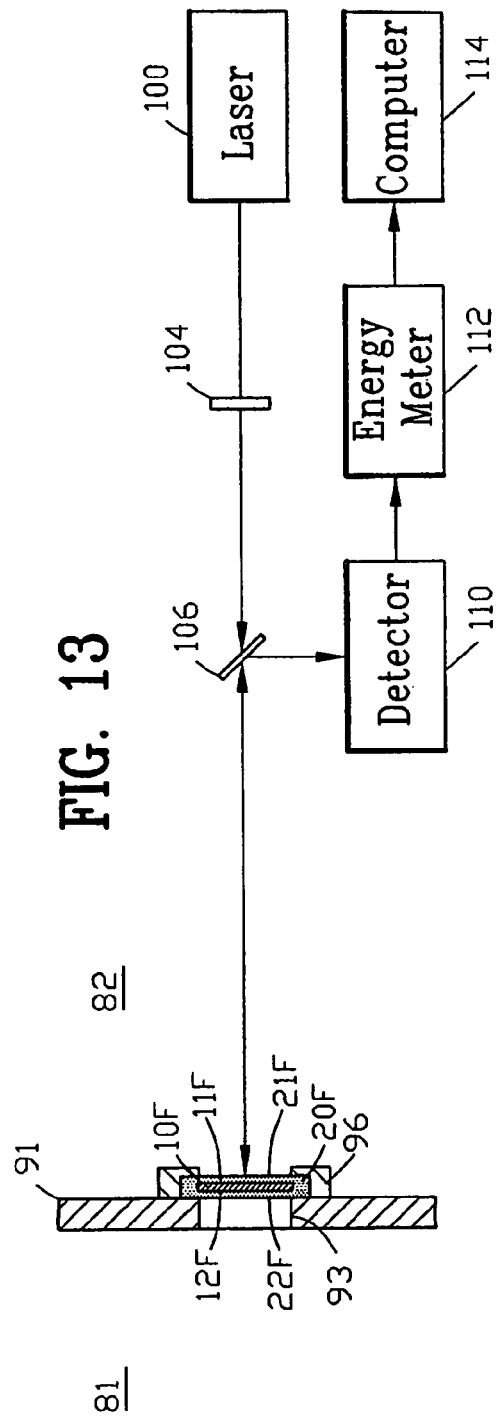

OPTICAL DEVICE AND METHOD OF MAKING

This application is a division of application Ser. No. 11/340,883 filed Jan. 26, 2006 now U.S. Pat. No. 7,951,632, application Ser. No. 11/340,883 filed Jan. 26, 2006 claims benefit of U.S. provisional patent application Ser. No. 60/647,678 filed Jan. 26, 2005. All subject matter set forth in application Ser. No. 11/340,883 and provisional patent application Ser. No. 60/647,678 is hereby incorporated by reference into the present application as if fully set forth herein.

BACKGROUND OF THE INVENTION

1. Field of the Invention

This invention relates to optical devices and more particularly to an improved apparatus and method for the fabrication of optical devices and electro-optical devices within a wide-bandgap semiconductor substrate by directing a thermal energy beam onto the wide-bandgap semiconductor substrate.

2. Description of the Related Art

Conventional semiconductors such as silicon have been used for various electrical, electronic and electro-optical devices. Conventional semiconductors are limited to operating temperatures below 250° C., due to the narrow band gap and poor thermal stability. There has been an increasing need to extend the limits of sensors for high temperature and harsh environments operations.

Wide-bandgap semiconductors have many advantages over conventional semiconductors such as silicon. One wide-bandgap semiconductor suitable for replacing conventional silicon-based devices is silicon carbide (SiC). The bandgap of 6H—SiC silicon carbide (SiC) is around 3 eV [2] which is about two times greater than the bandgap of silicon. Furthermore, silicon carbide (SiC) supports very high breakdown field, 3-5 MV/cm. The high sublimation temperature about 2700° C. and extremely low intrinsic carrier concentration allows silicon carbide (SiC) to operate at elevated temperatures. The dependence of intrinsic carrier concentration on temperature causes threshold voltage-shift and leakage current, resulting in device degradation and latchup phenomenon. The strong covalent bonds between Si and C yield high frequency lattice vibrations, generating high energy optical phonons (100-120 meV), that lead to a high saturation drift velocity (2×10 cm/s) and excellent thermal conductivity (490 W/m·K).

Silicon carbide (SiC) is the only wide bandgap semiconductor that has silicon dioxide as its native oxide analogous to silicon. Silicon carbide (SiC) is potentially superior to other compound semiconductors since silicon carbide (SiC), allows the creation of a metal oxide.

Silicon carbide (SiC) is a promising semiconductor material for optical devices, particularly mirrors and lenses because of its low thermal coefficient of expansion, hardness (and hence good polishability), high thermal conductivity (350-490 $Wm^{-1}K^{-1}$) and chemical stability in hostile environments.

Doping is a challenge for silicon carbide (SiC) due to the hardness, chemical inertness and the low diffusion coefficient of most impurities of silicon carbide (SiC). Current doping techniques for silicon carbide (SiC) device fabrication include epilayer doping and ion implantation.

Epilayer doping is introduced during chemical vapor deposition (CVD) epitaxial growth. Nitrogen (N) or phosphorous (P) are used as a doping material for n-type silicon carbide (SiC) whereas aluminum (Al) and boron (B) are used as a doping material for p-type silicon carbide (SiC). Vanadium (V) is used as a doping material for semi-insulating silicon carbide (SiC).

Ion implantation is the most common doping technique used for silicon carbide (SiC). However, ion implantation generates implantation-induced defect centers in the silicon carbide (SiC) and therefore, high annealing temperatures are required to remove this damage and to electrically activate the dopants. Some defects remain in silicon carbide (SiC) for up to 1700° C. annealing temperatures. Annealing at these high temperatures can cause severe surface damage due to silicon (Si) sublimation and redistribution.

A laser conversion technology for wide bandgap semiconductors including silicon carbide (SiC) is disclosed in the prior inventions of Nathaniel R. Quick. Discussion of wide bandgap materials and the processing thereof are set forth in U.S. Pat. Nos. 5,145,741; 5,391,841; 5,793,042; 5,837,607; 6,025,609; 6,054,375; 6,271,576 and 6,670,693 are hereby incorporated by reference into the present application.

The above prior inventions of Nathaniel R. Quick disclose the fabrication of various electrical and electronic devices. The present invention expands the prior inventions of Nathaniel R. Quick by fabricating optical devices and electro-optical devices in a wide bandgap semiconductor through a laser conversion process.

Therefore, it is an object of the present invention to provide optical devices and electro-optical devices and a method of making through a laser conversion process of a wide bandgap semiconductor.

It is an object of the present invention to provide an optical device and method of making by directing a thermal energy beam onto a selected portion of the wide-bandgap semiconductor substrate for changing an optical property of the selected portion to form the optical device.

Another object of the present invention is to provide an optical device and method of making an optical device on the surface of a wide-bandgap semiconductor substrate or within a wide-bandgap semiconductor substrate.

Another object of the present invention is to provide an optical device and method of making an optical device for defining a shape of the optical device in the wide-bandgap semiconductor substrate.

Another object of the present invention is to provide an optical device and method of making an optical device including the formation of electrodes on a wide bandgap semiconductor adjacent to the optical device for forming an electro-optical device.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to an improved optical device, comprising a wide-bandgap semiconductor substrate having a first optical property. An optical device is defined within the wide-bandgap semiconductor substrate having a second optical property different from the first optical property.

In another embodiment of the invention, the invention is incorporated into an electro-optical device, comprising a wide-bandgap semiconductor substrate having a first optical property. An optical device is defined within the wide-bandgap semiconductor substrate having a second optical property. A first and a second electrode are located in proximity to the optical device for changing the second optical property upon a change of a voltage applied to the first and second electrodes.

The invention is also incorporated into the method for making an optical device within a wide-bandgap semiconductor substrate. The method comprises the steps of providing a wide-bandgap semiconductor substrate. A thermal energy beam is directed onto a selected portion of the wide-bandgap semiconductor substrate for changing an optical property of the selected portion to convert the selected portion of the wide-bandgap semiconductor substrate into the optical device.

The invention is also incorporated into the method for making an electro-optical device within a wide-bandgap semiconductor substrate. The method comprises the steps of providing a wide-bandgap semiconductor substrate. A first thermal energy beam is directed onto a first selected portion of the wide-bandgap semiconductor substrate for changing an optical property of the first selected portion to convert the first selected portion of the wide-bandgap semiconductor substrate into the optical device. A second thermal energy beam is directed onto a second selected portion of the wide-bandgap semiconductor substrate for changing an electrical property of the second selected portion to convert the second selected portion of the wide-bandgap semiconductor substrate into the electrical device.

The invention is also incorporated into the method of measuring a temperature of a remote location. The method of measuring temperature comprises providing a wideband gap semiconductor sensor having an optical property that varies with temperature. The wideband gap semiconductor sensor is positioned in the remote location. The wideband gap semiconductor sensor is irradiated with an interrogating laser beam. The reflected radiation from the wideband gap semiconductor sensor is detected and processed to determine the temperature of the remote location.

The invention is also incorporated into the method of measuring pressure at a remote location. The method of measuring pressure comprises providing a wideband gap semiconductor sensor having an optical property that varies with applied pressure. The wideband gap semiconductor sensor is positioned in the remote location with the pressure of the remote location applied to a surface of the wideband gap semiconductor sensor. The wideband gap semiconductor sensor is irradiated with an interrogating laser beam. The reflected radiation from the wideband gap semiconductor sensor is detected and processed to determine the pressure at the remote location.

The invention is also incorporated into the method of measuring a chemical composition at a remote location. The method of measuring the chemical composition comprises providing a wideband gap semiconductor sensor having an optical property that varies with chemical composition. The wideband gap semiconductor sensor is positioned in the remote location with the chemical composition of the remote location applied to a surface of the wideband gap semiconductor sensor. The wideband gap semiconductor sensor is irradiated with an interrogating laser beam. The reflected radiation from the wideband gap semiconductor sensor is detected and processed to determine the chemical composition at the remote location.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which:

FIG. 12 is a diagram of a process of measuring the temperature of remote location with a wide-bandgap sensor;

FIG. 13 is a diagram of a process of measuring the pressure and/or composition of remote location with a wide-bandgap sensor;

Similar reference characters refer to similar parts throughout the several Figures of the drawings.

DETAILED DISCUSSION

Figure 1:
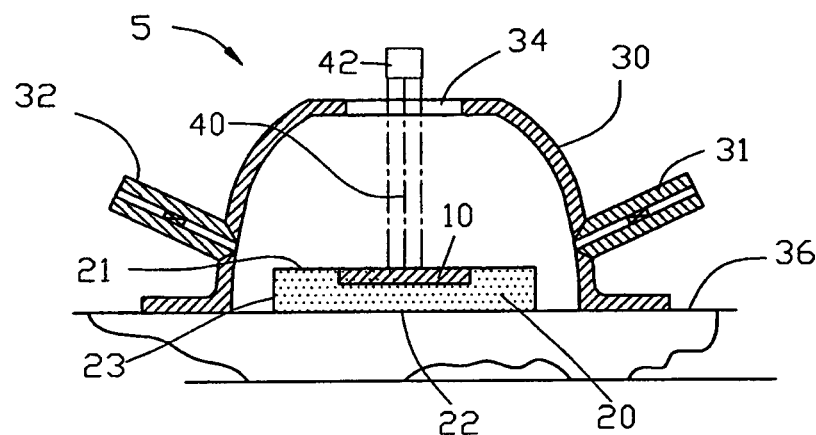
FIG. 1 is a side view of an air-tight chamber with a thermal energy beam impinging on a wide-bandgap semiconductor substrate for forming a first embodiment of an optical device.

FIG. 1 is a side view of an apparatus 5 for forming first embodiment of an optical device 10 on a wide-bandgap semiconductor substrate 20. The wide-bandgap semiconductor substrate 20 is shown located in an air-tight chamber 30. The chamber 30 has an inlet valve 31 and an outlet valve 32 connected to the side wall of the chamber 30. The inlet valve 31 and the outlet valve 32 permit the injection and removal of gases into and from air-tight chamber 30. The chamber 30 includes an airtight transmission window 34. The chamber 30 is disposed on a support member 36 forming an airtight seal therewith.

Figure 2:
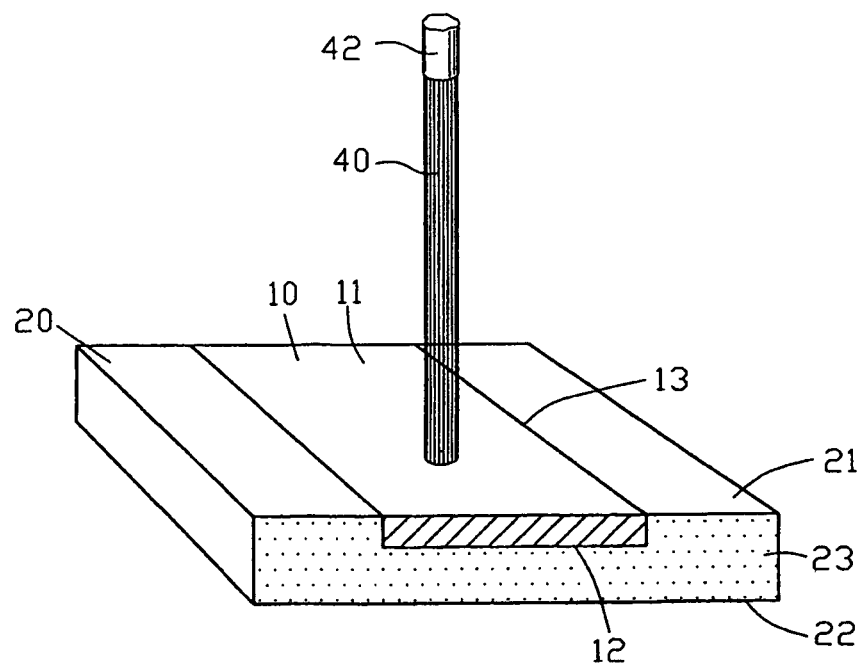
FIG. 2 is an enlarged isometric view of the first embodiment of the optical device formed on a surface of the wide-bandgap semiconductor substrate of FIG. 1.

FIG. 2 is an enlarged isometric view of the wide-bandgap semiconductor substrate 20 shown in FIG. 1. The wide-bandgap semiconductor substrate 20 defines a first and a second side 21 and 22 and a peripheral edge 23. Although the wide-bandgap semiconductor substrate 20 is shown as a square, the present invention is not limited by the physical configuration of the wide-bandgap semiconductor substrate 20 as shown herein.

A thermal energy beam 40 is shown emanating from a source 42 and passing through the airtight transmission window 34 to impinge on the first surface 21 of the wide-bandgap semiconductor substrate 20. In one example, the thermal energy beam 40 is a beam of charged particles such as a beam of electrons or a beam of ions. In another example, the thermal energy beam 40 is a beam of electromagnetic radiation such as a laser beam. Examples of a suitable source of the laser beam include a Nd:YAG laser, a frequency double $2_\omega$ Nd:YAG laser or an Excimer laser.

The optical device 10 is shown as a portion of the wide-bandgap semiconductor substrate 20 formed by causing relative movement between the wide-bandgap semiconductor substrate 20 and the thermal energy beam 40. The thermal energy beam 40 impinges on the wide-bandgap semiconductor substrate 20 to create the optical device 10 within the wide-bandgap semiconductor substrate 20. The thermal energy beam 40 is scanned in two dimensions across the first surface 21 of the wideband gap semiconductor substrate 20 to form the optical device 10. In this example, the first surface 11 of the optical device 10 is coincident with the first surface 21 of the wideband gap semiconductor substrate 20 with the remainder of the optical device 10 including the second surface 12 and the peripheral surface 13 being embedded within the wideband gap semiconductor substrate 20.

The wide-bandgap semiconductor substrate 20 may be formed as a monolith or a thin film substrate having suitable properties for forming the optical device 10 in the wide-bandgap semiconductor substrate 20. Preferably, the wide-bandgap semiconductor 20 has a bandgap greater than 2.0 electron volts. In one example, the wide-bandgap semiconductor 20 is selected from the group N of the periodic table and having a bandgap greater than 2.0 electron volts. In a more specific example of the invention, the wide-bandgap semiconductor 20 is essentially a single crystal structure.

In still a more specific example of the invention, the wide-bandgap semiconductor 20 may be a single crystal compound. The elements of the single crystal compound selected are from the group III and the group V of the periodic table and having bandgap greater than 2.0 electron volts. Preferably, one element of the compound has a higher melting point element than the other element of the compound. Specific examples of the wide-bandgap semiconductor compound are selected from the group consisting of Aluminum Nitride, Silicon Carbide, Boron Nitride, Gallium Nitride and diamond.

The inlet valve 31 and the outlet valve 32 in the side wall of the chamber 30 enables the introduction and removal of gases while the thermal energy beam 40 impinges on the wide-bandgap semiconductor substrate 20. Preferably, doping gases are introduced and removed from the air-tight chamber 30 during the thermal conversion process. The introduction and removal of doping gases from the air-tight chamber 30 changes the characteristics of the optical device 10 during the thermal conversion process.

Figure 3:
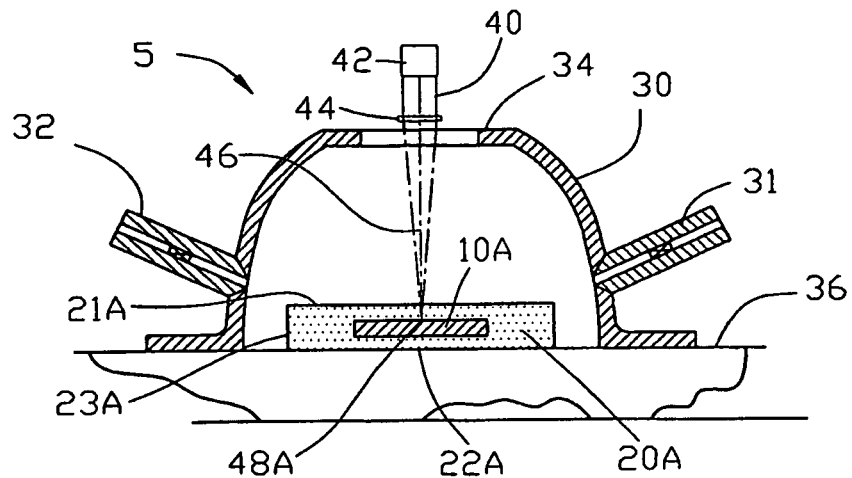
FIG. 3 is a side view of an air-tight chamber with a concentrated thermal energy beam impinging on a wide-bandgap semiconductor substrate for forming a second embodiment of an optical device.

FIG. 3 is a view similar to FIG. 1 illustrating the air-tight chamber 30 with a concentrated thermal energy beam 46 impinging on a second wide-bandgap semiconductor substrate 20A for forming a second embodiment of an optical device 10A. In this embodiment of the invention, the thermal energy beam 40 is passed through an optical element 44 shown as the lens to provide a concentrated thermal energy beam 46 converging at a focal point 48. The optical element 44 is located relative to the wideband gap semiconductor substrate 20A to focus the focal point 48 of the concentrated thermal energy beam 46 within the interior of the wideband gap semiconductor substrate 20A.

Figure 4:
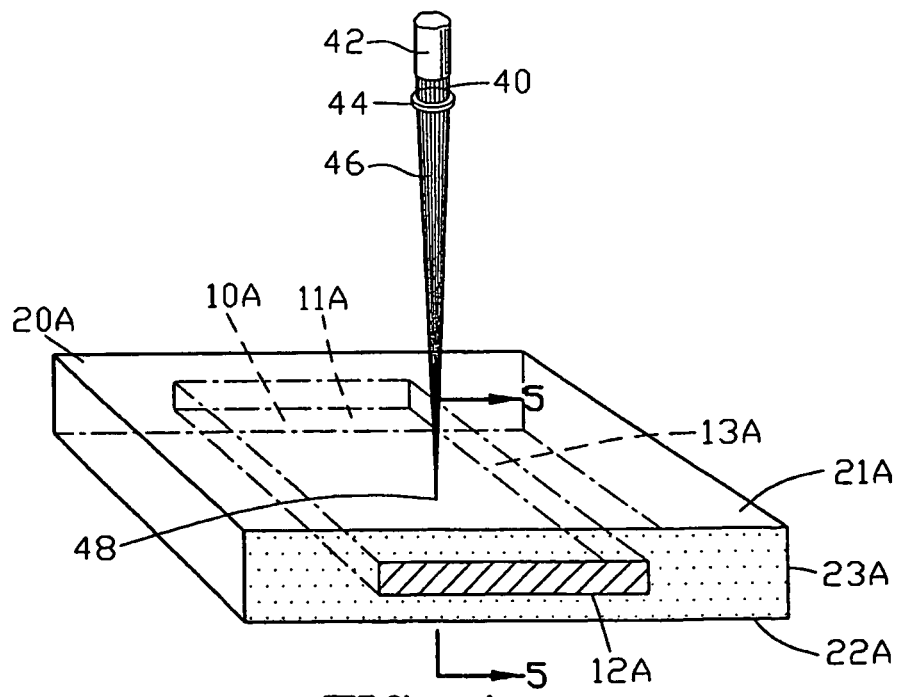
FIG. 4 is an enlarged isometric view of the second embodiment of the optical device formed within the wide-bandgap semiconductor substrate of FIG. 3.

FIG. 4 is an enlarged isometric view of the second embodiment of the optical device 10A formed within the wide-bandgap semiconductor substrate 20A of FIG. 3. A two-dimensional movement of the concentrated thermal energy beam 46 creates the optical device 10A to be totally within the wideband gap semiconductor substrate 20A.

The concentrated thermal energy beam 46 is adjusted such that the non-concentrated thermal energy beam 46 impinging upon the first surfaced 21A of the wide-bandgap semiconductor substrate 20A is insufficient in intensity to convert the wideband gap semiconductor substrate 20A into the optical device 10A. The intensity of the focal point 48 of the concentrated thermal energy beam 46 is sufficient to convert the wideband gap semiconductor substrate 20A into the optical device 10A. The optical device 10A is formed totally within the wideband gap semiconductor substrate 20A to protect optical device 10A by the surrounding wideband wideband gap semiconductor material 20A.

Figure 5:
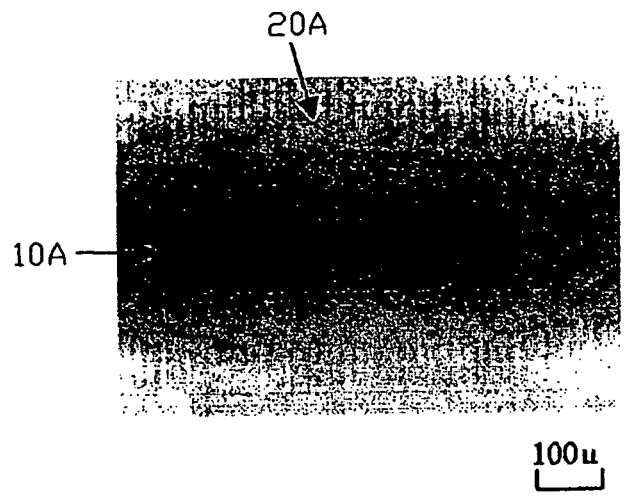
FIG. 5 is a reproduction of a photograph of a section of a wide-bandgap semiconductor substrate with the optical device embedded therein.

FIG. 5 is a reproduction of a photograph of a section of the wide-bandgap semiconductor substrate with an optical device embedded therein. The photograph is representative of the wide-bandgap semiconductor substrate 20A with the optical device 10A shown in FIGS. 3 and 4.

Figure 6:
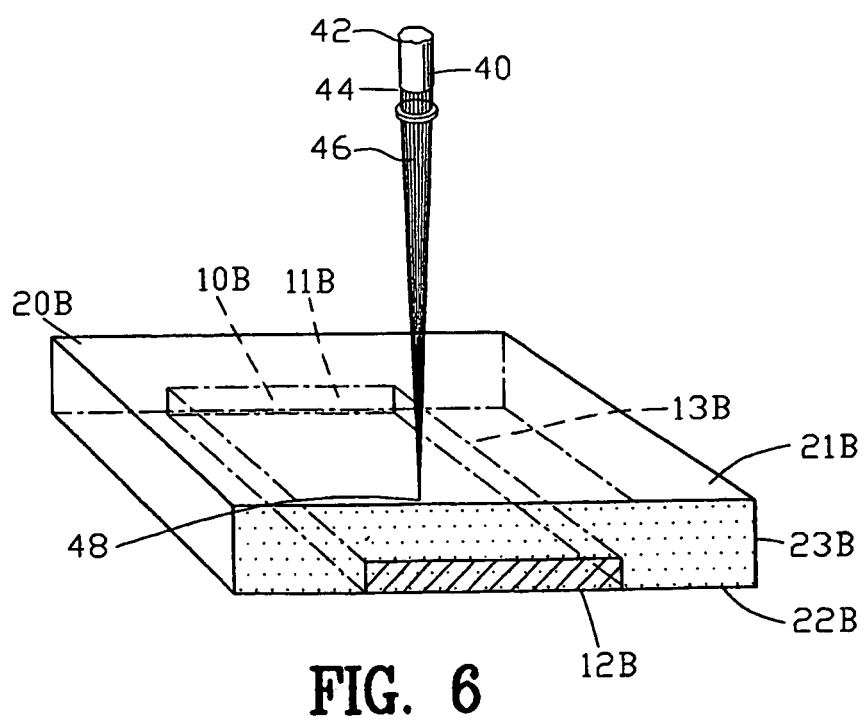
FIG. 6 is an enlarged isometric view of third embodiment of an optical device formed within the wide-bandgap semiconductor substrate.

FIG. 6 is an enlarged isometric view of the third embodiment of the optical device 10B formed within the wide-bandgap semiconductor substrate 20B. A two-dimensional movement of the concentrated thermal energy beam 46 creates the optical device 10B to be formed totally within the wideband gap semiconductor substrate 20B.

In this embodiment of the invention, the second surface 12B of the optical device 10B is coincident with the second surface 22B of the wideband gap semiconductor substrate 20B with the remainder of the optical device 10B including the first surface 11B and the peripheral surfaces 13B being embedded within the wideband gap semiconductor substrate 20B.

Figure 7:
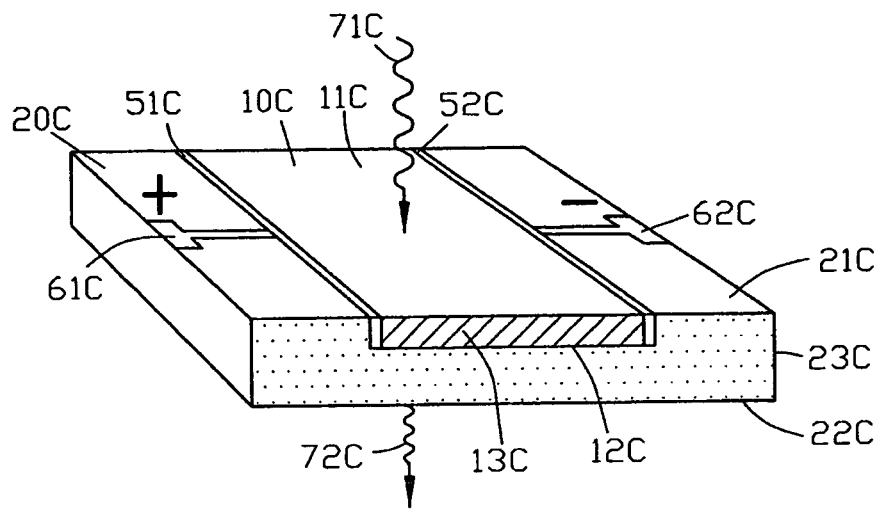
FIG. 7 is an enlarged isometric view of fourth embodiment of an electro-optical device formed within the wide-bandgap semiconductor substrate.

FIG. 7 is an enlarged isometric view of fourth embodiment of an electro-optical device 10C formed within the wide-bandgap semiconductor substrate 20C. The wide-bandgap semiconductor substrate 20C defines a first and a second side 21C and 22C and a peripheral edge 23C. In this example, the first surface 11C of the optical device 10C is coincident with the first surface 21C of the wideband gap semiconductor substrate 20C with the remainder of the optical device 10C including the second surface 12C and the peripheral surface 13C being embedded within the wideband gap semiconductor substrate 20C.

A first and a second electrode 51 and 52 are interconnected to opposed sections 13C' and 13C'' of the peripheral edge 13C of the optical device 10C. The first and second electrodes 51C and 52C are electrically connected to a first and second connector 61C and 62C. Preferably, the first and second electrodes 51C and 52C and the first and second connectors 61C and 62C are formed by the thermal conversion of the wide-bandgap semiconductor substrate 20C. The thermal conversion process for forming the first and second electrodes 51C and 52C and the first and second connectors 61C and 62C in the wide-bandgap semiconductor substrate 20C is set forth in my U.S. Pat. Nos. 5,145,741; 5,391,841; 5,793,042; 5,837,607; 6,025,609; 6,054,375; 6,271,576 and 6,670,693.

An incident wave 71C enters into the first side 21C of the wide-bandgap semiconductor substrate 20C and passes through the electro-optical device IOC to exit as an emerging wave 72C from the second side 22C of the wide-bandgap semiconductor substrate 20C. The emerging wave 72C exiting from the second side 22C of the wideband gap semiconductor substrate 20C is reduced in amplitude relative to the incident wave 71C entering into the first side 21C of the wideband gap semiconductor substrate 20C.

Figure 8:
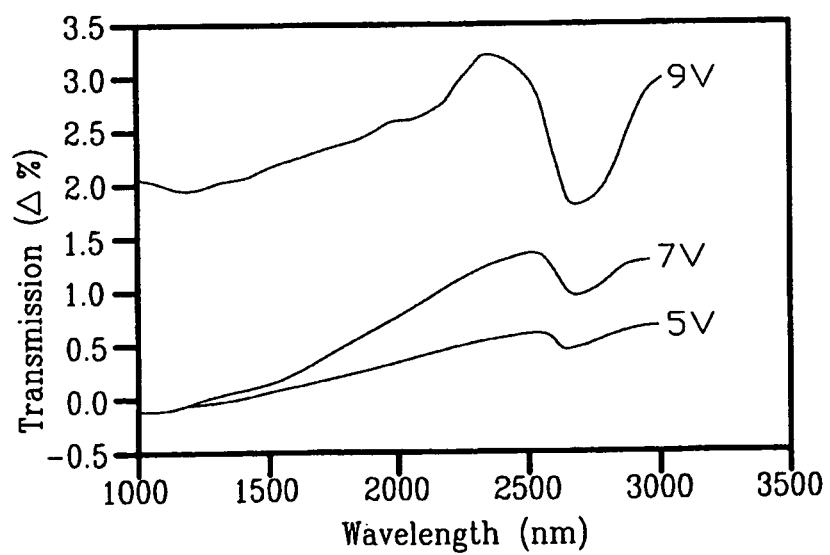
FIG. 8 is a graph of transmission as a function of wavelength for a series of applied voltages to the electro-optical device of FIG. 7.

FIG. 8 is a graph of percent of transmission as a function of wavelength for the electro-optical device 10C of FIG. 7. The graphs illustrate the percent of incident wave 71C entering into the first side 21C of the wide-bandgap semiconductor substrate 20C that exits as an emerging wave 72C from the second side 22C of the wideband gap semiconductor substrate 20C.

The curve labeled 5V illustrates the percent of incident wave 71C that exits as the emerging wave 72C with a 5 volt bias applied between the first and second electrodes 51C and 52C.

The curve labeled 7V illustrates the percent of incident wave 71C that exits as the emerging wave 72C with a 7 volt bias applied between the first and second electrodes 51C and 52C. The curve labeled 9V illustrates the percent of incident wave 71C that exits as the emerging wave 72C with a 9 volt bias applied between the first and second electrodes 51C and 52C. The series of curves 5V, 7V and 9V illustrate the percent of incident wave 71C that exits as an emerging wave 72C may be varies by the voltage applied to the first and second electrodes 51C and 52C.

Figure 9:
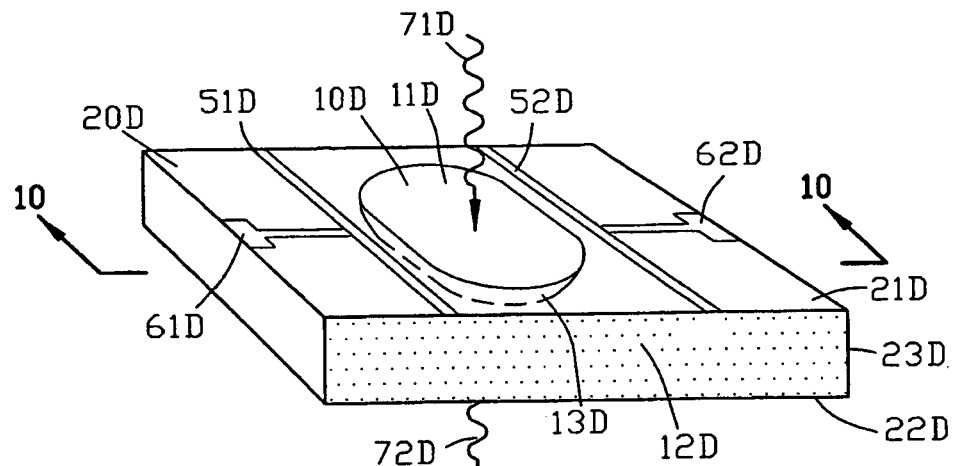
FIG. 9 is an enlarged isometric view of a fifth embodiment of an electro-optical device formed in a specific shape within the wide-bandgap semiconductor substrate.

FIG. 9 is a fifth embodiment of the invention illustrating an electro-optical device 10D formed in the wideband gap semiconductor substrate 20D. In this example, the optical device 10D is shown as a convex lens located within the wideband gap semiconductor substrate 20D. The shape of the lens 10D is formed concurrently with the conversion of the material of the wideband gap semiconductor substrate 20D into the optical device 10D. The shape of the optical device 10D may be formed by a number of methods including a three-dimensional movement of the thermal energy beam 40 and/or varying the intensity and/or the speed of movement of the thermal energy beam 40 impinging upon the wideband gap semiconductor substrate 20D. It should be appreciated by those skilled in the art that the convex lens 10D illustrated in FIG. 9 is merely an example of one type or shape of an optical device which may be formed by the present invention. It should be further appreciated by those skilled in the art that numerous other shapes, sizes and alterations of the optical device 10D may be formed in accordance with the practice of the present invention.

Figure 10:
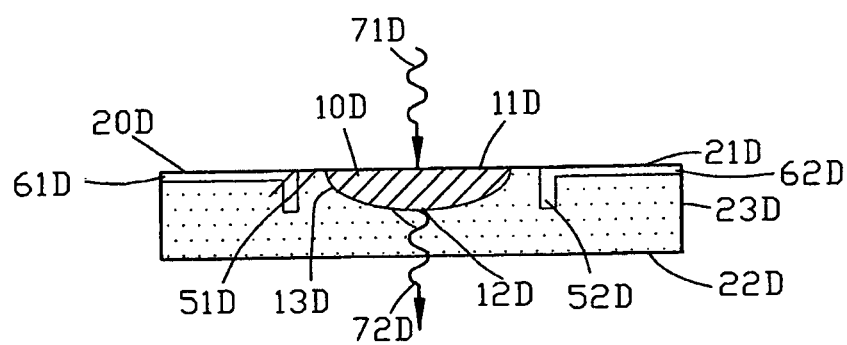
FIG. 10 is a sectional view along line 10-10 in FIG. 9.

FIG. 10 is a sectional view along line 10-10 in FIG. 9 further illustrating the shape of the optical device 10D. The incident wave 71D enters into the first side 21D of the wide-bandgap semiconductor substrate 20D and exits as an emerging wave 72D from the second side 22D of the wideband gap semiconductor substrate 20D after passing through the optical device 10D. The emerging wave 72D is shown symbolically exiting from the second side 22D to be parallel to the incident wave 71D enters into the first side 21D of the wide-bandgap semiconductor substrate 20D.

Figure 11:
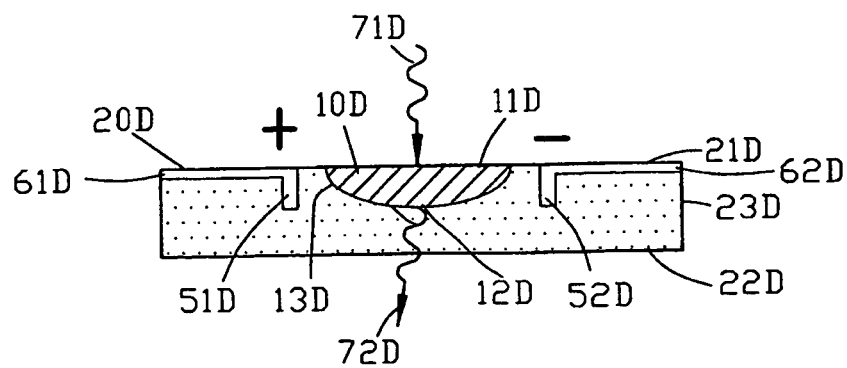
FIG. 11 is a sectional view similar to FIG. 10 with a voltage applied to the electro-optical device.

FIG. 11 is a sectional view similar to FIG. 10 with a voltage applied to the electro-optical device 10D. The voltage applied to the first and second electrodes 51D and 52D alters the refraction index of the electro-optical device 10D. The emerging wave 72D is shown symbolically exiting from the second side 22D to be refracted or altered in direction relative to the incident wave 71D entering into the first side 21D of the wide-bandgap semiconductor substrate 20D.

EXAMPLE I

Laser Synthesis of Optical Phases (Structures)

6H—SiC (single crystal with (0001) Si-face semi-insulating) wafers, 443 μm thick, were placed in a controlled environment and then irradiated with a scanning laser beam. Laser metallization surface and embedded metal-like conductive tracks were produced in both n-type and p-type SiC substrates by the laser direct write technique using inert ambient (Ar and He). Laser metallization is the conversion of a wide bandgap semiconductor to a conductor with a resistivity less than $10^{-2}$ ohm-cm without the addition of metal. Nanosecond-pulsed Nd:YAG ($\lambda$=1064 and 532 nm) and excimer ($\lambda$=193, 248 and 351 nm) lasers are used. These lasers are capable of laser metallization of insulating and semiconducting crystalline or polycrystalline wide-bandgap semiconductors necessary to fabricate and produce the various optical and electro-optical devices taught by the invention.

Laser doping experiments were conducted using a Nd:YAG laser of wavelength 1064 nm that can be operated in both continuous wave (CW) and Q-switched modes. For the Q-switched mode, the pulse repetition rate was varied from 2 to 35 kHz. The sample was placed inside a gas tight chamber where it was simultaneously irradiated with the laser and exposed to a dopant-containing ambient. Laser-doped tracks were formed on the sample surface by moving the chamber on a stepper motor-controlled translation stage. The height of the chamber was controlled manually through an intermediate stage to obtain different laser spot sizes on the SiC substrate surface. Nitrogen and Trimethylaluminum (TMA) were used as n-type and p-type dopant gases respectively. The sample was placed in nitrogen of pressure 30 psi for n-type doping. For p-type doping, TMA was separately heated in a bubbler until it evaporated and then a carrier gas Ar was passed through the bubbler to deliver the TMA vapor to the laser doping chamber through a gas tight tube. TMA decomposes at the laser-heated substrate surface producing Al atoms, which subsequently diffuse into the substrate. The SiC substrate was kept at room temperature before laser irradiation in all the experiments.

TABLE 1

Laser Processing Parameters.

| Laser processing region | Pulse energy (mJ) | Pulse repetition rate (kHz) | Focal length (mm) | Beam spot diameter (μm) | Laser fluence (J/cm$^2$) | Scanning speed (mm/s) | Irradiation passes |
|---|---|---|---|---|---|---|---|
| n-type zone | 4.7 | 3 | 150 | 300 | 6.65 | 1 | 1 |
| p-type zone | 5.5 | 2 | 150 | 300 | 7.75 | 1 | 1 |
| Laser metallization zone | 4.7 | 3 | 150 | 300 | 6.65 | 1 | 1 |

Dopant depth profiles were obtained using secondary ion mass spectroscopy (SIMS) with Cs and O2+ sources forming the primary beam. The energy and current of the primary beam were 8 keV and 1 μA respectively, and it was rastered over an area of 200 μm×200 μm of the laser-doped sample. The dopant depth was calculated from the sputtering rate and time.

Reflectivity and transmission of the as-received, laser metallization and laser doped wafers were measured. These data are used to calculate the optical constants.

Laser metallization of SiC without metal deposition relies on the ability of a laser beam to locally change the stoichiometry of SiC through intense photonic and thermal energy coupling between the beam and the substrate. Pulsed laser irradiation changes the stoichiometry by transforming SiC into either Si-rich or C-rich phases, depending on the chosen processing parameters.

Laser doping has been used to dope both n-type (nitrogen) and p-type (aluminum) dopants in SiC. For n-type doping nitrogen gas was used as a dopant precursor. SIMS (Secondary Ion Mass Spectroscopy) is used to obtain doping concentration profiles for the laser doping processing parameters defined in Table 1. The nitrogen concentration decreases slowly from a wafer surface concentration of approximately 1021 cm−3 to 1.5×1020 cm−3 at a depth of 3 μm. Curve extrapolation approximates a dopant depth of 4.5 μm.

The aluminum concentration at the wafer surface is approximately 2×1021 cm−3 and decreases to about 1.5×1020 cm−3 at a depth of approximately 1100 nm. Curve extrapolation approximates a dopant depth to be about 4.3 μm.

The values of diffusion coefficients for nitrogen and aluminum dopants are found to be 7×10−7 cm2/s and 4×10−7 cm2/s respectively, which are at least 5 orders of magnitude higher than the typical values of 5×10-12 cm2/s for nitrogen and 3×10-14 cm2/s~6×10-12 cm2/s for aluminum reported in the literature.

In a preliminary study an optical phase was created inside a polished single crystalline 4H—SiC substrate FIG. 5 with a high intensity laser beam. This embedded laser-metallized optical phase was tested for reflectivity using a green laser (wavelength, λ=532 nm). The reflectivity of both the laser-metallized and parent silicon carbide substrate were found to be 16% and 10% respectively. This is a reflectance increase of 60% for 532 nm wavelength irradiation, at room temperature.

Epitaxial SiC surfaces (epilayers) provide sufficient reflectivity for signal processing as shown in Table 2.

TABLE 2

Reflectivity of Wafer and Epitaxy 4H—SiC surfaces [1].

| Lasers | Reflectivity (%) of two types of reflecting surfaces | |
|---|---|---|
| | Epilayer | Substrate |
| Nd: YAG (□ = 1064 nm) | 20.6 | 15 |
| Green laser (□ = 532 nm) | 22.6 | 22.4 |

In this present invention the optical properties (reflectivity, transmission, absorption coefficient, refractive index and absorption index) of the parent 6H—SiC wafer and the laser synthesized embedded structures (e.g., n-type doped, p-type doped region and laser metallized structures) were calculated based on the transmitted (PT) and reflected (PR) powers measured at a laser wavelength of 1064 nm using intensities much less than those used in laser doping and laser metallization.

The reflectivity of laser synthesized embedded optical structures are increased by 40%; the parent wafer has a reflectivity of 20% and that for the laser synthesized structures are about 28%. Accordingly the transmission of the laser synthesized optical structures decrease to about 9% compared to 60.5% of the parent wafer.

Table 3 lists the calculated absorption coefficients, refractive index and absorption index for the parent 6H—SiC wafer and the laser fabricated embedded optical structures, all of which have been increased (particularly absorption coefficient and absorption index). The absorption index is three orders of magnitude larger compared to the parent wafer. In addition, reported absorption coefficients for 6H—SiC conventionally doped (e.g., ion implantation) do not exceed 200 cm−1 [6]; these laser doping results are greater than a factor of 15 higher.

TABLE 3

Room Temperature Optical Properties for Laser Doped Optical Structures in 6H—SiC measured at λ = 1064 nm

| Optical properties | Parent 6H—SiC | Laser doped (n-type) | Laser doped (p-type) | Laser metallization |
|---|---|---|---|---|
| Absorption coefficient (cm$^{-1}$) | 6.07 | $4.66 \times 10^3$ | $4.64 \times 10^3$ | $4.56 \times 10^3$ |
| Refractive index | 2.62 | 3.25 | 3.31 | 3.21 |
| Absorption index | $5.14 \times 10^{-5}$ | 0.039 | 0.039 | 0.039 |

These increases in absorption coefficient are probably related to the formation of a carbon rich composition formed by laser metallization. Laser irradiation raises the SiC surface to the peritectic reaction temperature (Tp≈2800° C.) thermally decomposing the SiC into a molten Si supersaturated with graphite. The change in the Si/C atomic ratio shifts the bandgap and therefore dramatically changes the absorptivity since the absorption is directly related to the bandgap.

Laser doping significantly increases the dopant concentration, compared to conventional doping (e.g., ion implantation) and, therefore, the corresponding effects of band filling, bandgap shrinkage and free carrier absorption increase the absorption coefficient.

Optical structures exhibiting elements of both laser metallization (e.g., a degree of Si/C atomic ratio change from a 1:1 stoichiometry) and laser doping are predicted to have the highest absorption coefficient, as observed.

EXAMPLE II

Embedded Optical Phases (Structures)

The laser beam can be focused within the SiC wafer. In addition, an incident laser beam is transmitted through the top surface of the 6H—SiC wafer and is focused by refraction in the SiC wafer to a smaller beam diameter in effect increasing laser beam intensity. This is a direct write process. Optical interferometry roughness measurements showed no deterioration in surface roughness of the embedded optical phase (e.g., a reflector) created adjacent to the back surface after this mode of laser metallization; consequently, no post anneal is required.

The fact that the width of the laser written reflector is smaller than the diameter of the incident focused laser beam is surprising and is not anticipated by Snell's Law. A plausible explanation is the activation of nonlinear absorption, which leads to the onset of a self-focusing effect in SiC wafers on the order of 443 μm thick.

The laser beam scanning for laser metallization and lsaser doping can be controlled to create an embedded optical lense, optical waveguide and optical concentrator.

EXAMPLE III

Laser Synthesized Electro-optical Device

A tunable optical filter is fabricated using laser synthesis technologies; primarily the tools of laser metalization and laser doping. An n-doped 4H—SiC substrate is irradiated with a laser beam to create two laser-metallized tracks along the paths of the laser beam. The original laser doped n-doped semiconductor material remains unaffected by the laser beam between these two tracks, resulting in the fabrication of a metal-semiconductor-metal (MSM) device. The transmissivity of infrared radiation through the semiconductor changes when voltage is applied to the MSM through the tracks. This observation makes it possible to use the MSM device as a tunable optical filter. The observed property of the MSM device provides a reconfigurable means of routing optical signals in three dimensions. It can also be used as a switch.

These processes enable the use of wide bandgap semiconductors (WBGS), which have higher breakdown voltages and therefore can accommodate higher voltages. A higher operational voltage (field) range allows optical property tunability over a larger electromagnetic wavelength range. For example, silicon shows tunability over 0.8 nm wavelength range (ref: N. Duovich et al, IEEE, J. Quantum Electron, 37, 1030-1039 (2001). Gallium Arsenide shows a tunablility range over 200 nm (ref: Website: Semiconductor Optoelectronic Device (Winter 2002).

Silicon carbide shows a tenability range >1850 nm as demonstrated from our preliminary experiments where we applied a maximum voltage of 9V. This tunability range can be futher increased with increase in applied voltage, say to 50V since wide bandgap semiconductors can tolerate higher breakdown voltages than either silicon or gallium arsenide (Table 4.).

applied bias can deplete a given donor level by sweeping its electronic carriers to the conduction band. This decreases the contribution of the sub-bandgap transition to the overall absorption at the corresponding wavelength. The free carriers swept to the conduction band increase the contribution of the free carrier absorption at a higher wavelength (i.e., lower frequency). Such behavior is responsible for the appearance of the maximum and minimum values in the transmission spectrum. The maximum corresponds to the wavelength with photon energy equal to the difference between the depleted donor level and the conduction band edge. On the other hand, the minimum value, obtained at a higher wavelength, has a particular value which depends on the dopant concentration and the density of states in the conduction band at a given temperature. It should be noted that the above-mentioned tunable optical response is only observed for SiC single crystal doped with donor concentration higher than 1019 cm−3. The application of a biasing voltage to a laser doped SiC wafer with laser metallized electrodes with dopant concentration lower than 1019 cm−3 did not reveal such a tunable response.

This example III demonstrates that photonic devices (e.g., waveguides, lenses, concentrators, etc.) exhibiting dynamically changing optical properties resulting from a change in biasing voltage can be fabricated by the combination of laser doping and laser metallization. Further, this example III demonstrates that the combination of laser doping and laser metallization can be used to fabricate integrated electronic and

TABLE 4

Semiconductor Properties

| Property | Silicon | Gallium Arsenide | 6H Silicon Carbide |
|---|---|---|---|
| Band Gap | 1.12 eV | 1.424 eV | 3 eV |
| Breakdown field | 0.3 MV/cm | 0.4 MV/cm | 3 MV/cm |
| Dielectric constant | 11.7 | 12.9 | 10 |
| Thermal Conductivity | 1.3 W/K-cm | 0.55 W/K-cm | 5 W/K-cm |
| Saturated electron drift velocity | $1 \times 10^7$ cm/sec | $1 \times 10^7$ cm/sec | $2 \times 10^7$ cm/sec |

The approach relies on the fact that the optical properties of n-type 4H—SiC are controlled by its free carrier concentration. Laser direct metallization is used to fabricate metal-like contacts in situ in n-type 4H—SiC (~5×1019 cm−3) substrates generating a conductor-semiconductor-conductor structure as shown in FIGS. 7 and 9. Here, Δ% Transmission=(% transmission at a biasing voltage V−% Transmission at zero bias). Application of a biasing voltage (either forward or reverse) between the two contacts in this structure affects the optical transmissivity of the n-type SiC semiconductor.

FIG. 8 shows that the transmission increases as the magnitude of the applied voltage increases over the wavelength range 1000-3000 nm at an applied bias of 5-9 volts. Measurements were taken from 350 nm. The difference between the maximum and minimum values increases with the applied bias.

These results indicate that the laser-metallized SiC can act as a tunable optical filter in the infrared regime. The origin of the tunability is related to the free carrier absorption phenomenon, i.e., the free carrier response to the incident electromagnetic field (at the IR wavelength) in the presence of the biasing voltage o r the electric field. Originally, when the sample is under no external bias the optical transmission at a given photon energy smaller than the bandgap is controlled by both the sub-bandgap transition and free carrier absorption. An photonic devices and, therefore, electro-optic, opto-electric, and integrated electronic-photonic circuits.

FIG. 11 is a diagram of the first embodiment of the optical device 10 being used for measuring temperature. In this example, the optical device 10 is formed as an optical temperature sensor device 10E. The optical temperature sensor device 10E is suitable for measuring temperature in a remote location 81 from an ambient location 82.

In this example, the remote location 81 is shown as a closure 90 having an opening 92 communicating the ambient 82. A transparent window 94 is positioned within the opening 92 by a mounting 96.

Although the remote location 81 has been shown as a closure, it should be understood that the remote location 81 may be any type of remote location. A few examples of the remote location 81 include chemical, mechanical and nuclear combustors, reactors and chambers as well as earth, planet and space locations, and biological species locations.

The optical temperature sensor device 10E is formed within the wide-bandgap semiconductor substrate 20E as previously described with reference to FIGS. 1 and 2. The wide-bandgap substrate semiconductor substrate 20E has a first and a second substrate surface 21E and 22E. The optical temperature sensor device 10E includes a first and a second optical surface 11E and 12E.

The wide-bandgap semiconductor substrate 20E is positioned within the remote location 81 with the first surface 11E of the optical temperature sensor device 10E facing the transparent window 94.

An interrogating laser 100 projects an incident laser beam 101 through a polarizing filter 104 and a beam splitter 106. The incident laser beam 101 projects through the transparent window 94 to irradiate upon the optical temperature sensor device 10E. For oblique incidence, the reflected power was measured without the beam splitter 106.

The first and second surfaces 11E and 12E of the optical temperature sensor device 10E reflect the incident laser beam 101 as reflected radiation 102. The beam splitter 106 reflects the reflected radiation 102 to impinge upon a detector 110. The output of the detector 110 is connected to a power meter 112 and a computer 114 for data analysis and processing.

The incident laser beam 101 irradiating upon the optical temperature sensor device 10E is a coherent light beam. Although it should be understood that various light sources may be used to interrogated the optical temperature sensor device 10E, a continuous wave He—Ne laser operating at a wavelength of 632.8 nm has been found to be suitable for the practice of this invention.

The reflected radiation 102 from the first and second surfaces 11E and 12E of the optical temperature sensor device 10E forms interference pattern (not shown) that impinges on the detector 110. The output of the detector 110 is analyzed by a power meter 112 and a computer 114 to determine the temperature of the remote location 81. A more detailed explanation of the process the data from the detector by the power meter and the computer is set forth hereinafter.

FIG. 12 is a diagram of the second embodiment of the optical device 10A being used for measuring pressure and/or chemical composition. In this example, the optical device 10 is formed as an optical sensor device 10F. The optical sensor device 10F is suitable for measuring pressure and/or chemical composition in a remote location 81 from an ambient location 82.

In this example, the remote location 81 is shown separated by a ambient 82 by a wall closure 91 having an opening 93. It should be understood that the remote location 81 may be any type of remote location as heretofore described.

The optical sensor device 10F is formed within the wide-bandgap semiconductor substrate 20F as previously described with reference to FIGS. 3-5. The wide-bandgap substrate semiconductor substrate 20F has a first and a second substrate surface 21F and 22F. The optical sensor device 10F includes a first and a second optical surface 11F and 12F.

The wide-bandgap semiconductor substrate 20F is secured within the opening 93 by a mounting 96. The wide-bandgap semiconductor substrate 20F is positioned such that the first surface 11F of the optical sensor device 10F is exposed to the ambient location 82 and facing the interrogating laser 100. The wide-bandgap semiconductor substrate 20F is positioned further to expose the second surface 12F of the optical sensor device 10F to the remote region 81. Although the optical sensor device 10F is shown located within the opening 93, it should be understood that the present invention is not limited to the specific physical arrangement, location and mounting of the optical sensor device 10F within the remote region 81.

An interrogating laser 100 projects an incident laser beam 101 through a polarizing filter 104 and a beam splitter 106. The incident laser beam 101 irradiates upon the optical sensor device 10F.

The first and second surfaces 11F and 12F of the optical sensor device 10F reflect the incident laser beam 101 as reflected radiation 102. The beam splitter 106 reflects the reflected radiation 102 to impinge upon a detector 110. The output of the detector 110 is connected to a power meter 112 and a computer 114 for data analysis and processing.

The incident laser beam 101 irradiating upon the optical sensor device 10F is a coherent light beam. Although it should be understood that various light sources may be used to interrogated the optical temperature sensor device 10F, a continuous wave He—Ne laser operating at a wavelength of 632.8 nm has been found to be suitable for the practice of this invention.

The reflected radiation 102 from the first and second surfaces 11F and 12F of the optical sensor device 10F forms interference pattern (not shown) that impinges on the detector 110. The output of the detector 110 is analyzed by a power meter 112 and a computer 114 to determine the temperature of the remote location 81.

A continuous wave He—Ne laser operating at a wavelength of 632.8 nm is used as the probe beam to interact with the SiC sensor remotely as a function of temperature. The reflected power is measured with an optical power detector connected to a power meter. The data collection process is computerized to provide accurate value of temperature and power. Both the reflected power and temperature are collected in a time-synchronized manner by using the computer. The optical response of the sensor is evaluated for defined incident angles of (0°) and (45°). For normal incidence, the beam is partially transmitted through the beam splitter placed at 45° angle with respect to the incident beam. The beam splitter was specifically designed to operate at 632.8 nm wavelength. A fraction of this beam is reflected and transmitted by the sensor.

Figure 14:
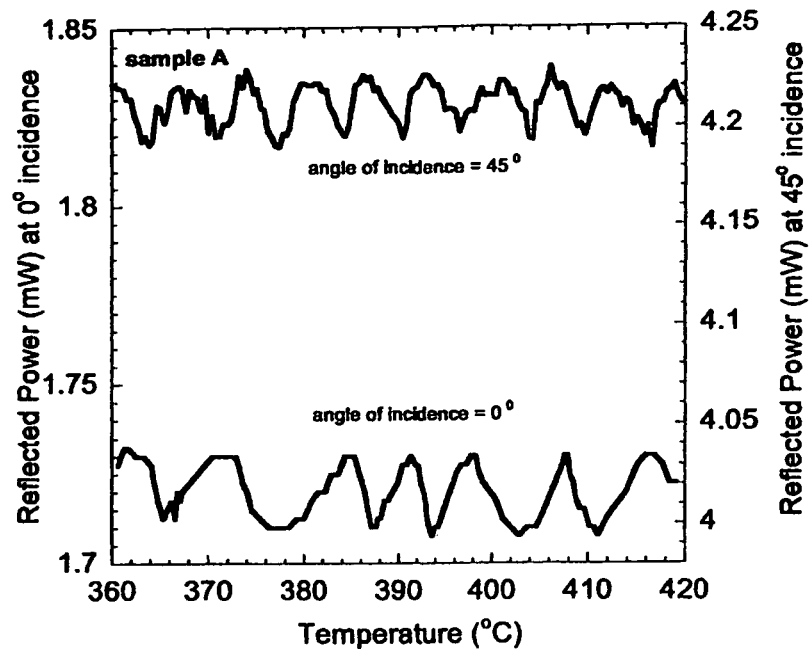
FIG. 14 is a graph illustrating the reflected power for a sample A as a function of temperature from 27° C. to 750° C. for a zero degree (0°) and a forty-five degree (45°) incidence angle.

FIG. 14 is a graph illustrating the reflected power for a sample A as a function of temperature from 27° C. to 750° C. for a zero degree (0°) and a forty-five degree (45°) incidence angle.

Figure 15:
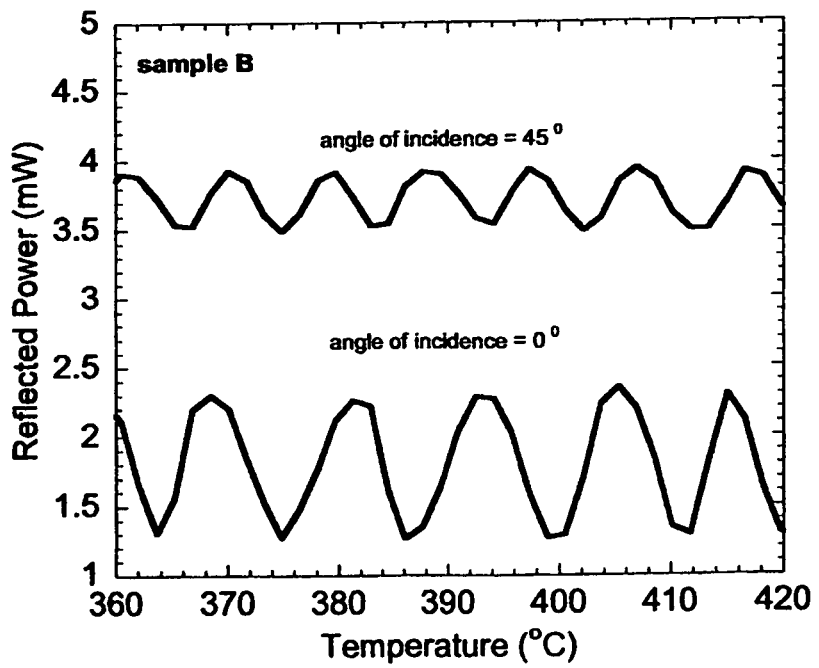
FIG. 15 is a graph illustrating the reflected power for sample B as a function of temperature from 27° C. to 750° C. for a zero degree (0°) and a forty-five degree (45°) incidence angle.

FIG. 15 is a graph illustrating the reflected power for sample B as a function of temperature from 27° C. to 750° C. for a zero degree (0°) and a forty-five degree (45°) incidence angle.

Figure 16:
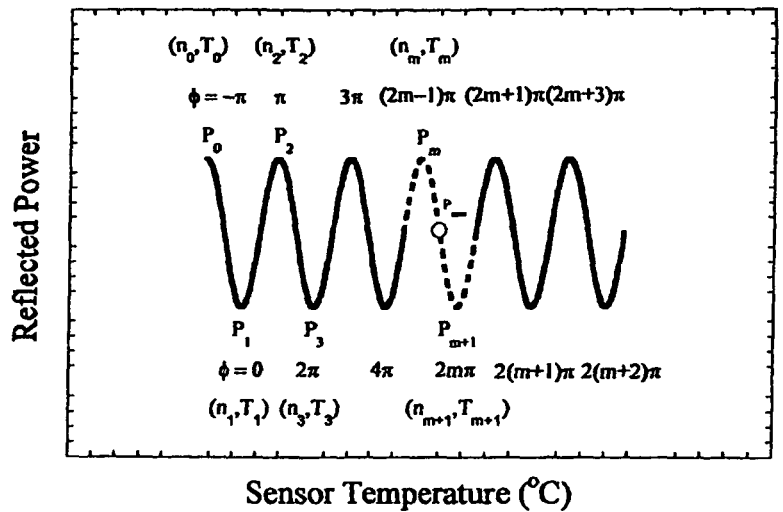
FIG. 16 is a graph illustrating a typical oscillatory reflected power profile commonly referred to as a complementary Airy pattern showing the phase angles between the adjacent branches of the oscillations.

FIG. 16 is a graph illustrating a typical oscillatory reflected power profile commonly referred to as a complementary Airy pattern showing the phase angles between the adjacent branches of the oscillations.

Figure 17:
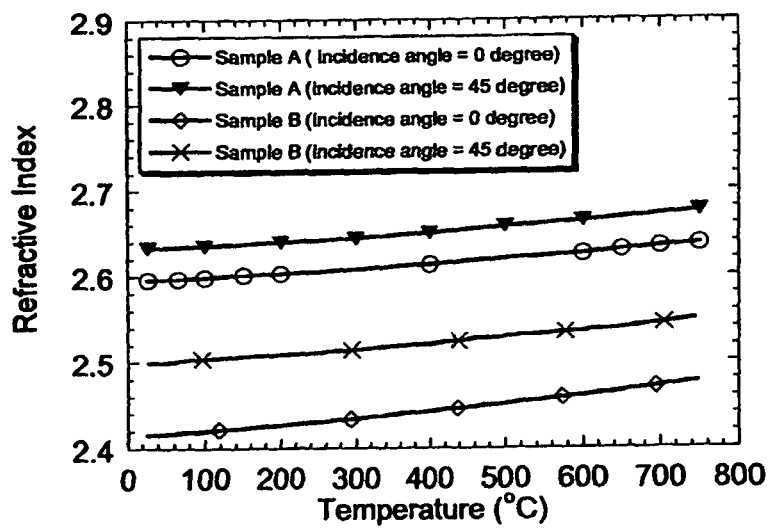
FIG. 17 is a graph of the refractive index for sample A and B, from 27° C. up to 750° C., for 0° and 45° incidence angle.

FIG. 17 is a graph of the refractive index for sample A and B, from 27° C. up to 750° C., for 0° and 45° incidence angle.

Figure 18:
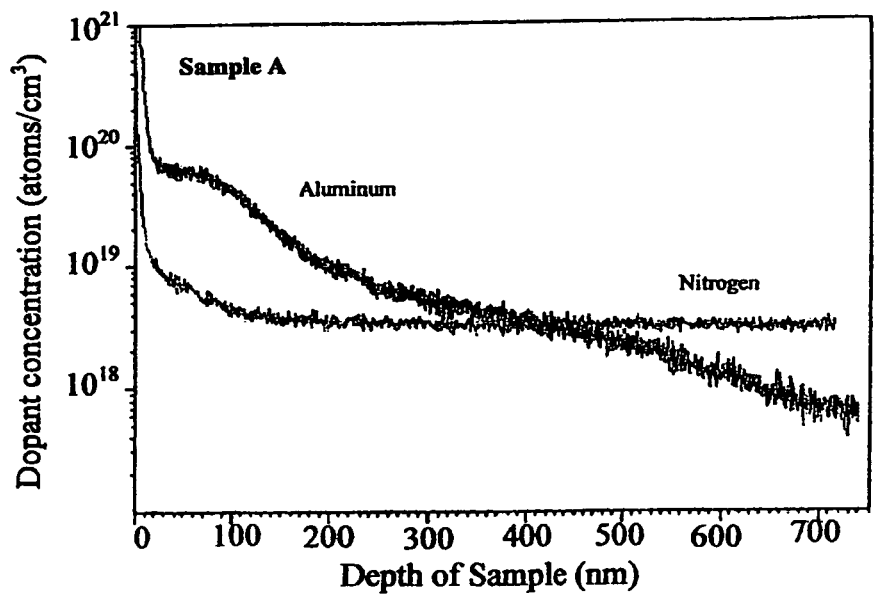
FIG. 18 is a graph illustrating the concentration depth profiles of Aluminum and Nitrogen measured with SIMS for sample A.

FIG. 18 is a graph illustrating the concentration depth profiles of Aluminum and Nitrogen measured with SIMS for sample A.

Figure 19:
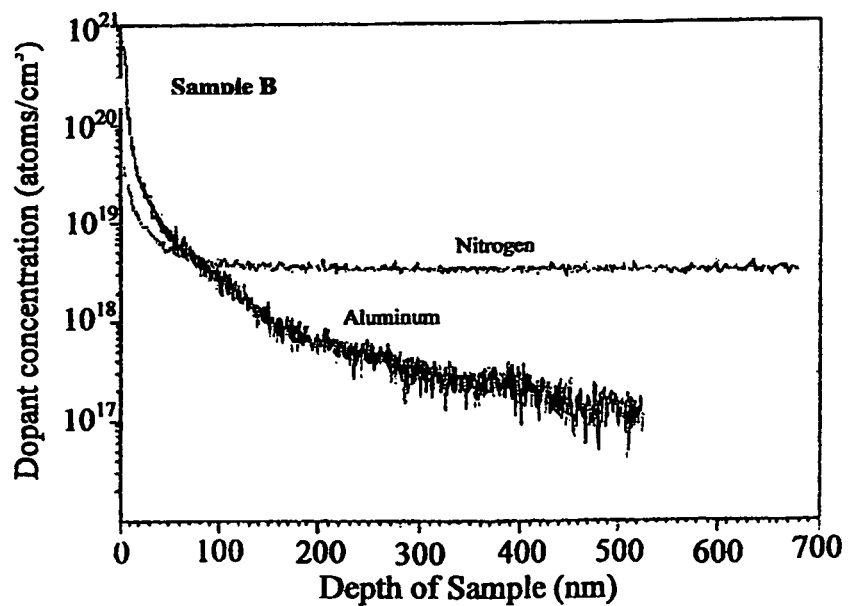
FIG. 19 is a graph illustrating the concentration depth profiles of Aluminum and Nitrogen measured with SIMS for sample B.

FIG. 19 is a graph illustrating the concentration depth profiles of Aluminum and Nitrogen measured with SIMS for sample B.

Figure 20:
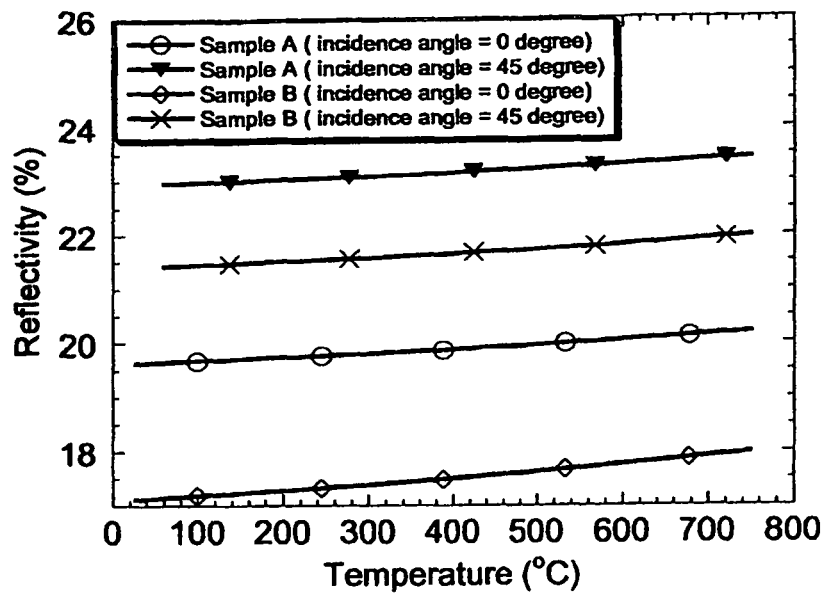
FIG. 20 is a graph illustrating the reflectivity plot for sample A and B, as a function of temperature from 27° C. up to 750° C. for 0° and 45° incidence angle.

FIG. 20 is a graph illustrating the reflectivity plot for sample A and B, as a function of temperature from 27° C. up to 750° C. for 0° and 45° incidence angle.

Figure 21:
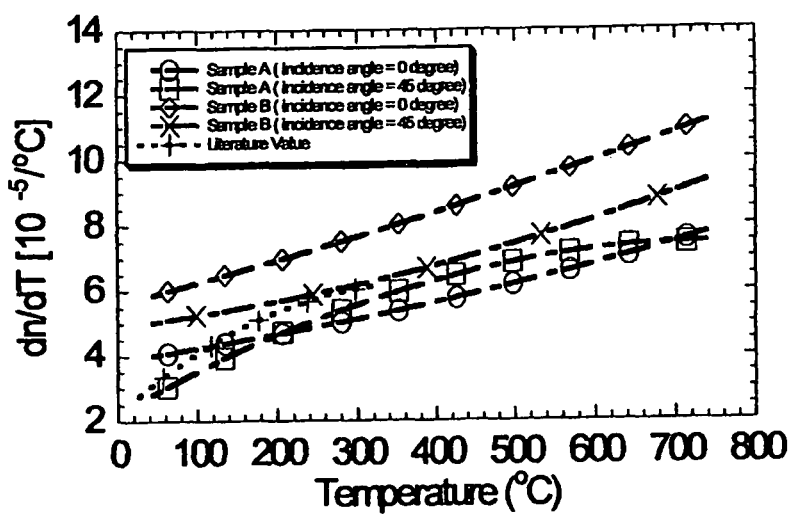
FIG. 21 is a graph illustrating the thermo optic coefficient for sample A and B from 27° C. up to 750° C. for 6H silicon carbide (SiC) for 0° and 45° incidence angle and literature value for 6H silicon carbide (SiC) at 1.5 micro meter wavelength.

FIG. 21 is a graph illustrating the thermo optic coefficient for sample A and B from 27° C. up to 750° C. for 6H silicon carbide (SiC) for 0° and 45° incidence angle and literature value for 6H silicon carbide (SiC) at 1.5 micro meter wavelength.

Figure 22:
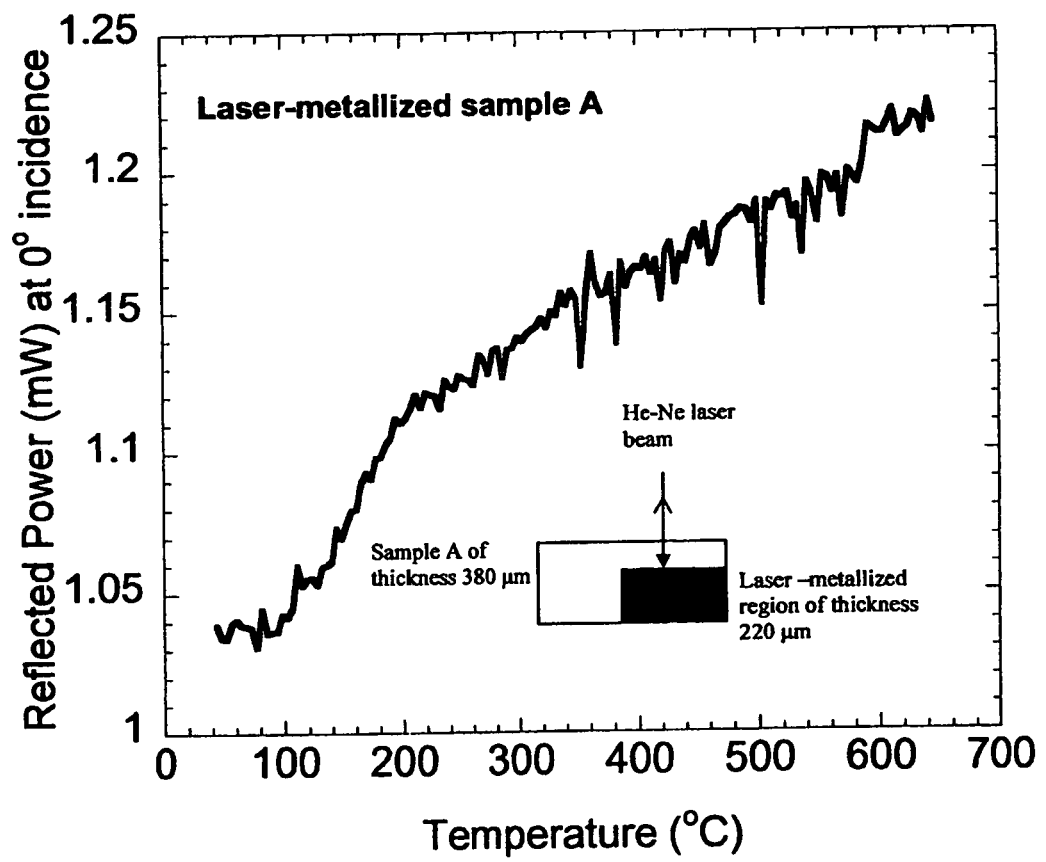
FIG. 22 is a graph illustrating the reflected power for laser-metallized sample as a function of temperature for normal incidence of a He—Ne laser beam of power incident on a substrate the wafer is 6.7 mW.

FIG. 22 is a graph illustrating the reflected power for laser-metallized sample as a function of temperature for normal incidence of a He—Ne laser beam of power incident on a substrate the wafer is 6.7 mW.

Analytical Program

Several sets of the reflected power were measured for each of the laser-doped samples A and B in accordance with the doping profile in FIGS. 18 and 19. A representative set is presented in FIGS. 14 and 15, respectively. The measured reflected power has definite oscillatory patterns as a function of the sensor temperature as indicated in FIGS. 14A 14B. The type and a mount of dopant atoms present in the SiC wafer and thickness may also affect the nature of the patterns. Since both surfaces of the samples were polished, a portion of the beam transmitted through the top surface of the sample is reflected by the inner bottom surface and this reflected light undergoes multiple reflections inside the sample, i.e., within the thickness of the sample. At each reflection point, a portion of the beam transmits through the top surface and these transmitted beams interfere to form the observed oscillatory pattern. On the other hand, the actual scattered power is obscured by these oscillations, hindering the exact evaluation of reflectivity using the measured power data because such data contain the effects of multiple reflections and the power of the specular reflected light. Due to the oscillatory patterns, the standard deviation in the estimated reflected power as a function of temperature becomes large. The phase angles of the interference fringes, which are manifested through the oscillatory patterns as a function of temperature FIGS. 14A and 14B can be used to extract the refractive index and thermo-optic coefficient by considering that the wafer is inherently a Fabry-Pérot etalon where the top and bottom surfaces of the sample serve as reflecting surfaces.

Refractive Index Analytical Program

The optical properties of the sensor were calculated using the oscillatory reflected power ($P_R$) obtained as a function of the sensor temperature for a defined incident angle. For the case of multiple reflections, the reflected light intensity pattern is given by the following complementary Airy function $$\frac{I_r}{I_i} = \frac{F \sin^2 \phi}{1 + F \sin^2 \phi} \quad (1)$$

where $I_i$ is the incident flux density, $I_r$, the reflected flux density, F is the coefficient of finesse given by $F = [2\sqrt{R}/(1-R)]^2$, R is the reflectance of the sample. The phase angle $\phi$ of the interference fringes (oscillatory pattern of the reflected power in this study) is given by $\phi = 2\pi n_s d/\lambda_0$, where $n_s$ is the refractive index of the sample (silicon carbide), d is the thickness of the sample and $\lambda_0$ is the wavelength of the incident light in vacuum. Noting that $n_s$ and d vary with temperature, the variation of $\phi$ with respect to temperature can be obtained as follows by using the above expression for $\phi$ $$\frac{\partial \phi}{\partial T} = \frac{2\pi d}{\lambda_o} \frac{\partial n}{\partial T} + \frac{2\pi n}{\lambda_o} \frac{\partial d}{\partial T} \quad (2)$$

$$= \frac{2\pi d}{\lambda_o} \left( \frac{\partial n}{\partial T} + \alpha n \right)$$

where $$\alpha = \frac{1}{d} \frac{\partial d}{\partial T},$$

which is the thermal expansion coefficient of the wafer. Its value for 6H—SiC is given by $$\alpha = 3.19 \times 10^{-6} + 3.60 \times 10^{-9} \times T - 1.68 \times 10^{-12} \times T^2 \quad (3)$$

in the unit of $K^{-1}$, where T is the sensor temperature in Kelvin. The phase shift of the reflected wave between any two adjacent maximum and minimum reflected powers is $\pi$. Let $P_m$ and $P_{m+1}$ two such adjacent data points as shown in FIG. 15. The refractive index and temperature of the sensor corresponding to these two data points are $n_m$, $T_m$ and $n_{m+1}$, $T_{m+1}$ respectively such that $T_{m+1} > T_m$. Assuming the curve to be linear between the points $P_m$ and $P_{m+1}$ in the oscillatory pattern and applying the central finite difference approximation to (2) at the midpoint of this straight line, an expression for $n_{m+1}$ can be obtained as follows $$n_{m+1} = \frac{1}{1 + \frac{\alpha_{mid} \Delta T}{2}} \left[ \frac{\lambda_0}{2d} + \left(1 - \frac{\alpha_{mid} \Delta T}{2}\right) n_m \right]. \quad (4)$$

Here $\alpha_{mid}$ is the thermal expansion coefficient of the sensor material at the temperature corresponding to the midpoint ($P_{mid}$) of the straight line $P_m P_{m+1}$ in FIG. 15, i.e., $$\alpha_{mid} = \alpha \left( \frac{T_m + T_{m+1}}{2} \right)$$

and $\Delta T = T_{m+1} - T_m$. Knowing the refractive index ($n_0$) of SiC at room temperature ($T_0$), the refractive indices can be obtained at higher temperatures by using (4).

Examples of Refractive Index Analytical Program

Experiments were carried out to obtain the values of n0 for samples A and B. The powers of the He—Ne laser beam reflected by and transmitted through each of the samples were measured at room temperature (T0). Based on these data, the refractive index (n0) and absorption index (k0) were calculated by using the Fresnel reflection formula, Beer-Lambert law and the relationship between the absorption coefficient and absorption index. For normal incidence, the values of n0 and k0 were found to be 2.596±0.247 and (7.448±0.331)×10−5, and 2.416±0.266 and (6.739±0.318)×10$^{-5}$ for samples A and B respectively. Similarly for 45° angle of incidence, the values of $n_0$ and $k_0$ were found to be 2.633±0.483 and (3.913±0.322)×10$^{-5}$, and 2.499±0.447 and (3.540±0.322)×10$^{-5}$ for samples A and B respectively. Now, (4) can be applied to obtain the refractive index at higher temperatures. However, (4) needs to be implemented over each branch of the oscillation in each cycle, i.e., n needs to be calculated as $n_1$ for temperature $T_1$, $n_2$ for temperature $T_2$ and so on. Here the temperature difference, e. g., $T_2 - T_1$ or $T_3 - T_2$, should be on the same branch within each cycle as shown in FIG. 3. The refractive indices are plotted in FIG. 16 as a function of temperature. The refractive indices for oblique incidence are slightly higher than that for normal incidence, which may be due to the crystal structure of 6H—SiC polytype. 6H—SiC is a uniaxial, anisotropic crystal and the refractive index of such materials varies with the incident angle. This type of material will have varying refractive index lying between two extrema corresponding to the refractive indices obtained for lights traveling along the $c^\perp$ or $c^\parallel$ axis of the crystal. The prior art reported refractive indices 2.63 and 2.67 along $c^\perp$ and $c^\parallel$ axes respectively for 6H—SiC at room temperature, confirming that the refractive index depends on the orientation of the crystal lattice relative to the incident light.

The refractive indices of the two samples are also different as shown in FIG. 16. This difference may be due to the differences in their dopant (both n- and p-type dopants) concentrations as shown in FIGS. 5 and 6 for samples A and B respectively. The effect of dopant concentrations on the refractive index is given by the following expression [23]-[25]

$$\Delta n = -\frac{e^2 \lambda_0^2}{8\pi^2 c^2 n_u \varepsilon_0}(N_e/m_{ce}^* + N_h/m_{ch}^*) \quad (5)$$

which is based on a free carrier model. Here $\Delta n = n_u - n$, $n_u$ and n are the refractive indices of undoped and doped wafers respectively, e is the electronic charge, $\lambda_0$ is the optical wavelength in vacuum, $N_e$ is the free electron concentration pertaining to the n-type dopant atoms, $N_h$ is the free hole concentration pertaining to the p-type dopant atoms, $m^*_{ce}$ and $m^*_{ch}$ are the conductivity effective masses of electrons and holes respectively. Equation (5) was derived under the approximations that $\omega^2 \tau^2 \gg 1$ and the square of absorption index is negligible compared to the square of refractive index, where $\omega = 2\pi c/\lambda$ and $\tau$ is the relaxation time of free carriers. These approximations hold good for silicon in the wavelength range of 1.2 to 1.8 μm. In the present case of SiC samples, the absorption indices have been noted above as negligibly smaller than the refractive indices. Also in the visible wavelength of the He—Ne laser, $\omega^2 \tau^2$ would be much larger than unity. Therefore (5) can be applied to the silicon carbide samples A and B to indicate that their dopant concentrations affect their refractive indices.

Based on curve-fits, the variation of the refractive index with temperature is given by the following expressions were θ= the incident angle:

Sample A:

$$n = 2.59 + 3.84 \times 10^{-5} \times T + 1.84 \times 10^{-8} \times T^2 + 7.07 \times 10^{-12} \times T^3 \text{ for } \theta_i = 0° \quad (6a)$$

$$n = 2.63 + 2.2 \times 10^{-5} \times T + 7.07 \times 10^{-8} \times T^2 - 3.16 \times 10^{-11} \times T^3 \text{ for } \theta_i = 45° \quad (6b)$$

Sample B:

$$n = 2.41 + 5.61 \times 10^{-5} \times T + 3.18 \times 10^{-8} \times T^2 + 5 \times 10^{-12} \times T^3 \text{ for } \theta_i = 0° \quad (7a)$$

$$n = 2.49 + 4.89 \times 10^{-5} \times T + 1.62 \times 10^{-8} \times T^2 + 1.23 \times 10^{-11} \times T^3 \text{ for } \theta_i = 45° \quad (7b)$$

Reflectivity Analytical Program

For the randomly polarized laser beam in this study, the beam was assumed to consist of 50% perpendicular component and 50% parallel component. The calculated net reflectivity (R) is the contribution of these components as given below.

$$R = 0.5 \times R_{TE} + 0.5 \times R_{TM} \quad (8)$$

For normal incidence, the reflectivity can be approximated by the following expression:

$$R = \frac{(n_s - 1)^2}{(n_s + 1)^2} \quad (9)$$

Based on the refractive indices given by 6(a, b) and 7(a, b), the reflectivities of samples A and B were calculated as a function of temperature as presented in FIG. 19. Based on curve-fits, the variation of the reflectivity with temperature is given by the following expressions:

Sample A:

$$R = 19.61 + 5.27 \times 10^{-4} \times T + 2.52 \times 10^{-7} \times T^2 + 9.24 \times 10^{-11 \times T3} \text{ for } \theta_i = 0° \quad (10a)$$

$$R = 22.97 + 1.38 \times 10^{-4} \times T + 1.10 \times 10^{-6} \times T^2 - 6.17 \times 10^{-10 \times T3} \text{ for } \theta_i = 45° \quad (10b)$$

Sample B:

$$R = 17.09 + 7.97 \times 10^{-4} \times T + 4.50 \times 10^{-7} \times T^2 + 6.26 \times 10^{-11} \times T^3 \text{ for } \theta_i = 0° \quad (11a)$$

$$R = 21.4 + 5.52 \times 10^{-4} \times T + 1.57 \times 10^{-7} \times T^2 + 1.73 \times 10^{-10} \times T^3 \text{ for } \theta_i = 45° \quad (11b)$$

Thermo-Optic Coefficient Analytical Program

Thermo-optic coefficient (dn/dT), which is the rate of change of refractive index with temperature, was obtained by taking the derivative of the third order polynomial fit of refractive index as a function of temperature. This factor is important in optoelectronic device applications such as switches, modulators and filters. The thermo-optic coefficients of optical materials are generally in the range of $10^{-3}$ to $10^{-5}$. The data reported in the prior art for 6H—SiC at 1.5 μm have also been plotted along with the results of this study in FIG. 19. The thermo-optic coefficients are approximately $10^{-5}$ °C.$^{-1}$ for both samples A and B. The thermo-optic coefficient is the derivative of refractive index and, therefore, it is very sensitive to the changes in refractive index with respect to temperature. Small errors due to averaging and curve fitting may influence the derivate, i.e., the thermo-optic coefficient. This can be observed in FIG. 19 as the data for sample A follow a different trend at both the normal and oblique incident angles, whereas the data are found to be similar for sample B.

Laser Metallization to Create Monotonic Response

In FIGS. 14 and 15, the reflected powers are oscillatory, i.e., multi-valued functions of temperature. In other words, the optical responses in these two figures are not monotonically increasing or decreasing functions of temperature. Therefore such data cannot be used directly to measure temperature by using SiC as a thermal sensor in practical applications. To obtain a better optical response that can be used directly for temperature measurement, the microstructure inside sample A was modified by irradiating the sample with a high intensity Nd:YAG pulsed laser beam (average laser power=2.5 W, pulse repetition rate=5 kHz, beam radius at the surface of the sample=45 to 55 μm with the laser focal spot being 5 mm above the top surface of the sample, laser beam scanning speed=1 mm/s) in the presence of argon gas at 30 psi pressure. This process is known as laser metallization in which localized heating by the high intensity laser beam disorders the crystalline structure of SiC and produces carbon-rich phases which usually exhibit metal-like properties. The laser parameters were chosen properly to modify the microstructure inside sample A. The optical response of this laser-metallized sample was obtained as a function of temperature for the He—Ne laser as presented in FIG. 18, which shows that the oscillations of the reflected power are negligibly small compared to the oscillations in FIGS. 14 and 15. Due to this, the reflected power in FIG. 18 can be considered as a monotonic function of temperature.

Figure 23A:
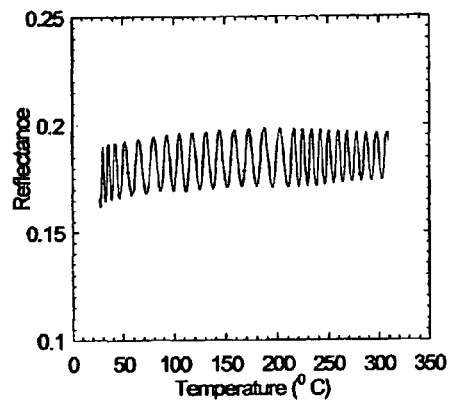
FIG. 23A is a graph illustrating reflected power of a silicon carbide sensor upon exposure to nitrogen gas at a pressure as a function of temperature at a pressure of 14.7 psi.

FIG. 23A is a graph illustrating reflected power of a silicon carbide sensor upon exposure to nitrogen gas at a pressure as a function of temperature at a pressure of 14.7 psi.

Figure 23B:
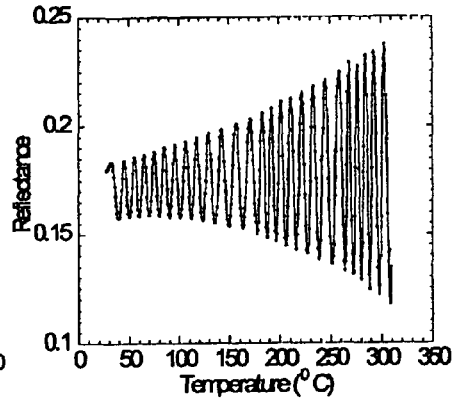
FIG. 23B is a graph illustrating reflected power of a silicon carbide sensor upon exposure to nitrogen gas at a pressure as a function of temperature at a pressure of 100 psi.

FIG. 23B is a graph illustrating reflected power of a silicon carbide sensor upon exposure to nitrogen gas at a pressure as a function of temperature at a pressure of 100 psi.

Figure 23C:
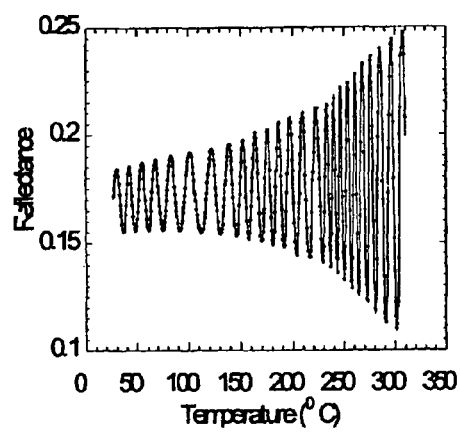
FIG. 23C is a graph illustrating reflected power of a silicon carbide sensor upon exposure to nitrogen gas at a pressure as a function of temperature at a pressure of 200 psi.

FIG. 23C is a graph illustrating reflected power of a silicon carbide sensor upon exposure to nitrogen gas at a pressure as a function of temperature at a pressure of 200 psi.

Figure 23D:
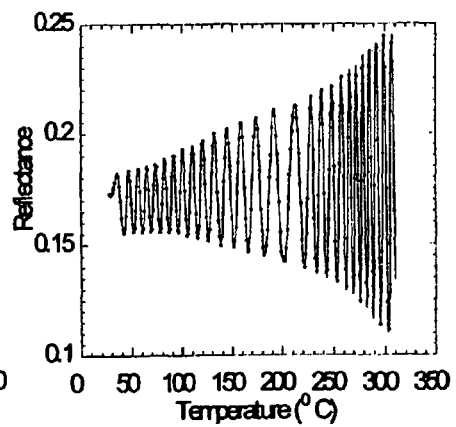
FIG. 23D is a graph illustrating reflected power of a silicon carbide sensor upon exposure to nitrogen gas at a pressure as a function of temperature at a pressure of 400 psi.

FIG. 23D is a graph illustrating reflected power of a silicon carbide sensor upon exposure to nitrogen gas at a pressure as a function of temperature at a pressure of 400 psi.

Figure 24A:
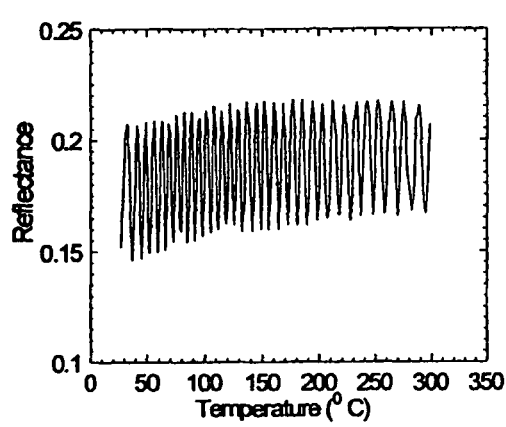
FIG. 24A is a graph illustrating reflected power of a silicon carbide sensor upon exposure to argon gas at a pressure as a function of temperature at a pressure of 14.7 psi.

FIG. 24A is a graph illustrating reflected power of a silicon carbide sensor upon exposure to argon gas at a pressure as a function of temperature at a pressure of 14.7 psi.

Figure 24B:
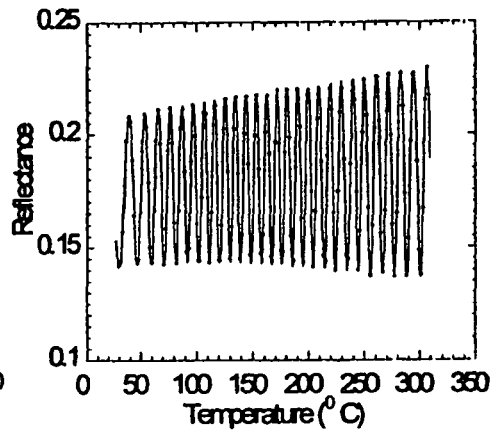
FIG. 24B is a graph illustrating reflected power of a silicon carbide sensor upon exposure to argon gas at a pressure as a function of temperature at a pressure of 100 psi.

FIG. 24B is a graph illustrating reflected power of a silicon carbide sensor upon exposure to argon gas at a pressure as a function of temperature at a pressure of 100 psi.

Figure 24C:
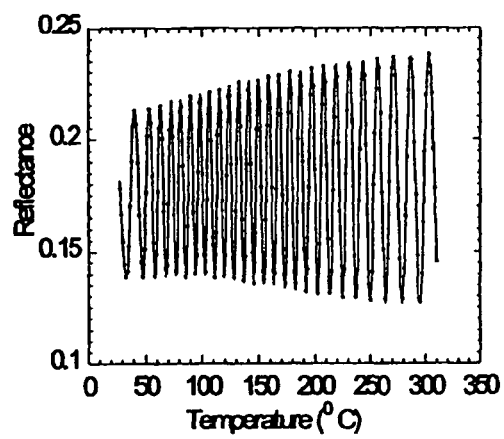
FIG. 24C is a graph illustrating reflected power of a silicon carbide sensor upon exposure to argon gas at a pressure as a function of temperature at a pressure of 200 psi.

FIG. 24C is a graph illustrating reflected power of a silicon carbide sensor upon exposure to argon gas at a pressure as a function of temperature at a pressure of 200 psi.

Figure 24D:
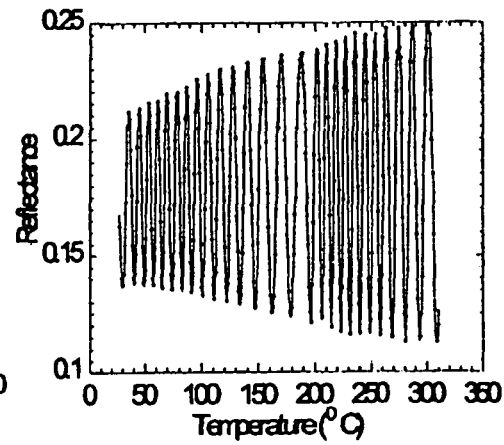
FIG. 24D is a graph illustrating reflected power of a silicon carbide sensor upon exposure to argon gas at a pressure as a function of temperature at a pressure of 400 psi.

FIG. 24D is a graph illustrating reflected power of a silicon carbide sensor upon exposure to argon gas at a pressure as a function of temperature at a pressure of 400 psi.

Figure 25:
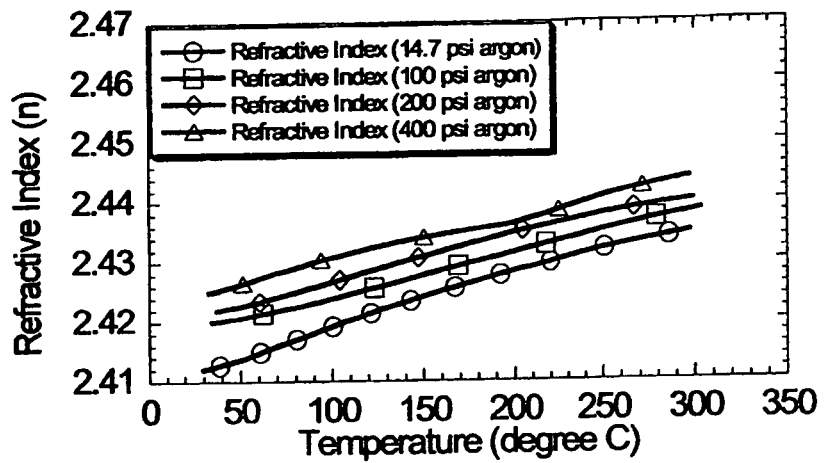
FIG. 25 is a graph of the refractive index of silicon carbide sensor when exposed to nitrogen as a function of temperature at pressures of 14.7 psi, 100 psi, 200 psi and 400 psi.

FIG. 25 is a graph of the refractive index of silicon carbide sensor when exposed to nitrogen as a function of temperature at pressures of 14.7 psi, 100 psi, 200 psi and 400 psi.

Figure 26:
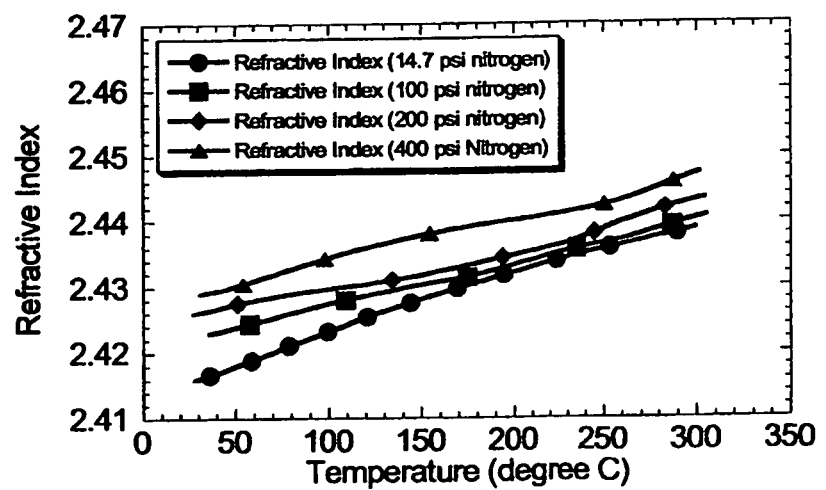
FIG. 26 is a graph of the refractive index of silicon carbide sensor when exposed to argon as a function of temperature at pressures of 14.7 psi, 100 psi, 200 psi and 400 psi.

FIG. 26 is a graph of the refractive index of silicon carbide sensor when exposed to argon as a function of temperature at pressures of 14.7 psi, 100 psi, 200 psi and 400 psi.

Figure 27:
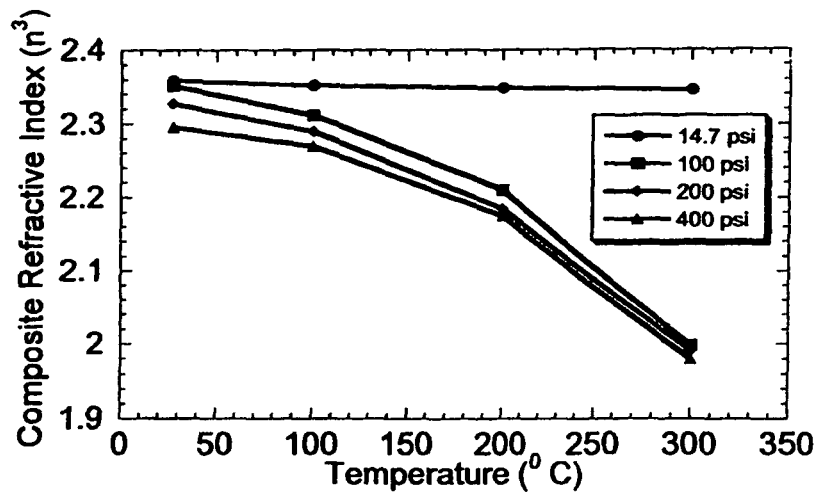
FIG. 27 is a graph of the refractive index of a composite layer upon exposure to Nitrogen as a function of temperature at pressures of 14.7 psi, 100 psi, 200 psi and 400 psi.

FIG. 27 is a graph of the refractive index of a composite layer upon exposure to Nitrogen as a function of temperature at pressures of 14.7 psi, 100 psi, 200 psi and 400 psi.

Figure 28:
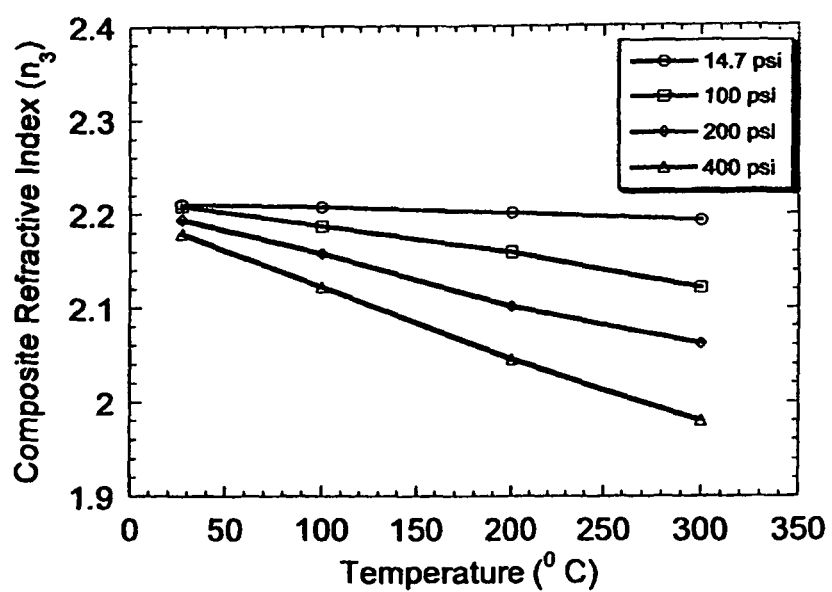
FIG. 28 is a graph of the refractive index of a composite layer upon exposure to argon as a function of temperature at pressures of 14.7 psi, 100 psi, 200 psi and 400 psi.

FIG. 28 is a graph of the refractive index of a composite layer upon exposure to argon as a function of temperature at pressures of 14.7 psi, 100 psi, 200 psi and 400 psi.

Figures 29A, 29B:
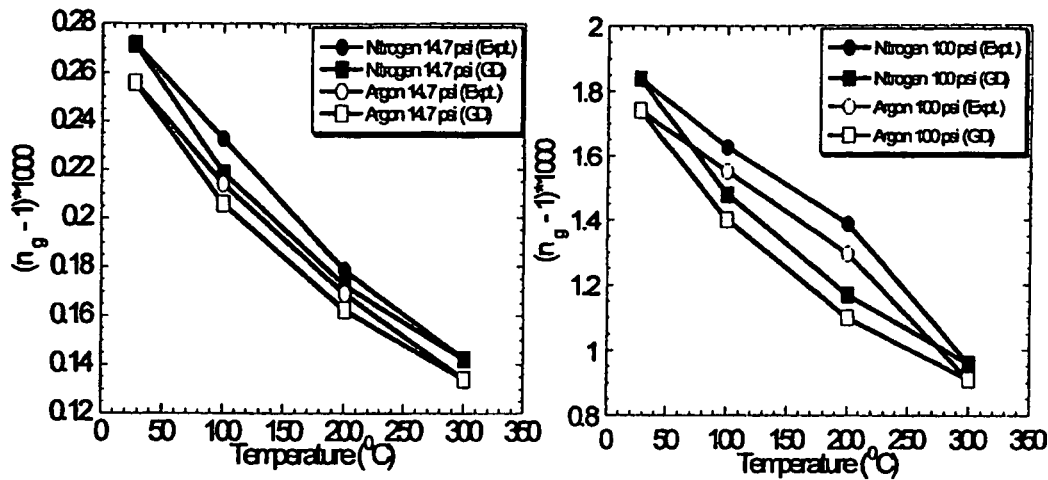
FIG. 29A is a graph illustrating refractive index of the composite layer sensor upon exposure to Nitrogen and Argon gas at a pressure as a function of temperature at a pressure of 14.7 psi.
FIG. 29B is a graph illustrating refractive index of the composite layer sensor upon exposure to Nitrogen and Argon gas at a pressure as a function of temperature at a pressure of 100 psi.

FIG. 29A is a graph illustrating refractive index of the composite layer sensor upon exposure to Nitrogen and Argon gas at a pressure as a function of temperature at a pressure of 14.7 psi.

FIG. 29B is a graph illustrating refractive index of the composite layer sensor upon exposure to Nitrogen and Argon gas at a pressure as a function of temperature at a pressure of 100 psi.

Figures 29C, 29D:
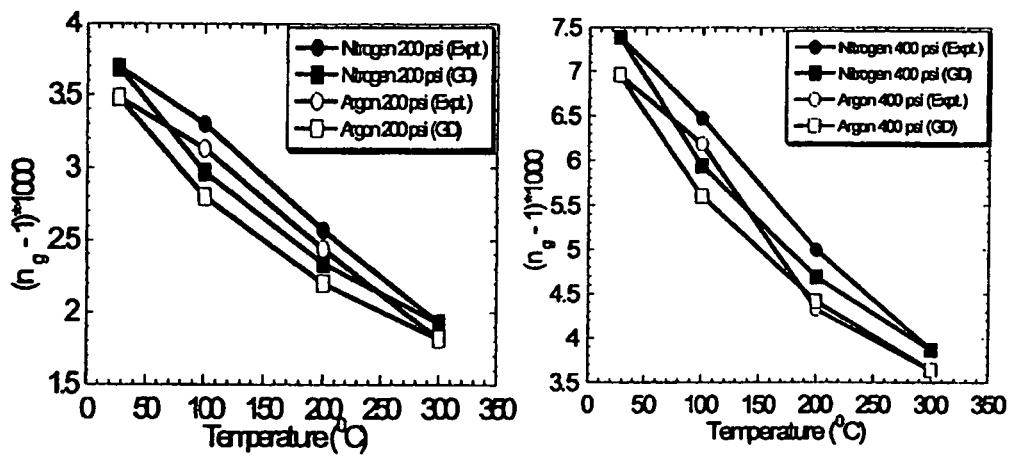
FIG. 29C is a graph illustrating refractive index of the composite layer sensor upon exposure to Nitrogen and Argon gas at a pressure as a function of temperature at a pressure of 200 psi.
FIG. 29D is a graph illustrating refractive index of the composite layer sensor upon exposure to Nitrogen and Argon gas at a pressure as a function of temperature at a pressure of 400 psi.

FIG. 29C is a graph illustrating refractive index of the composite layer sensor upon exposure to Nitrogen and Argon gas at a pressure as a function of temperature at a pressure of 200 psi.

FIG. 29D is a graph illustrating refractive index of the composite layer sensor upon exposure to Nitrogen and Argon gas at a pressure as a function of temperature at a pressure of 400 psi.

Figure 30A:
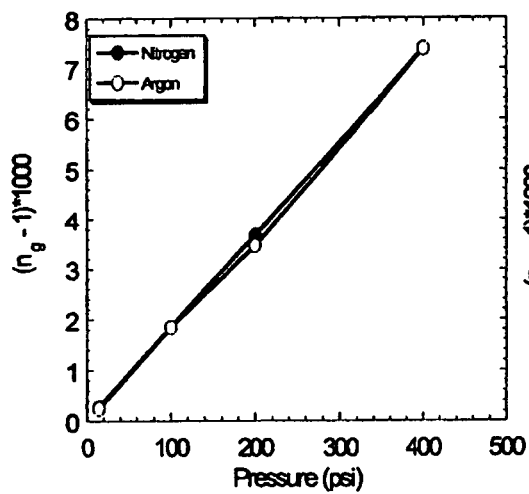
FIG. 30A is a is a graph illustrating refractive index of Nitrogen and Argon gas as a function of pressure at a temperature of 27° C.

FIG. 30A is a is a graph illustrating refractive index of Nitrogen and Argon gas as a function of pressure at a temperature of 27° C.

Figure 30B:
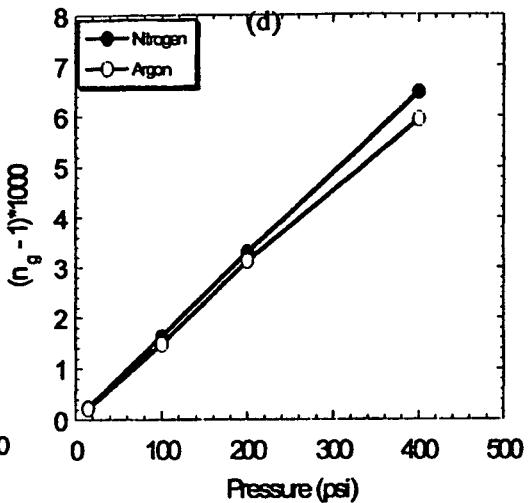
FIG. 30B is a is a graph illustrating refractive index of Nitrogen and Argon gas as a function of pressure at a temperature of 100° C.

FIG. 30B is a is a graph illustrating refractive index of Nitrogen and Argon gas as a function of pressure at a temperature of 100° C.

Figure 30C:
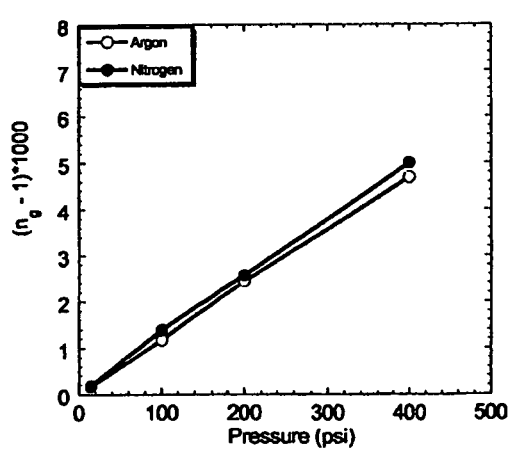
FIG. 30C is a is a graph illustrating refractive index of Nitrogen and Argon gas as a function of pressure at a temperature of 200° C.
Figure 30D:
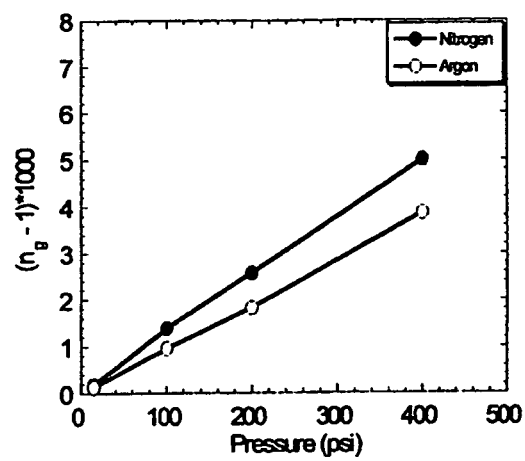
FIG. 30D is a is a graph illustrating refractive index of Nitrogen and Argon gas as a function of pressure at a temperature of 300° C.

FIG. 30C is a is a graph illustrating refractive index of Nitrogen and Argon gas as a function of pressure at a temperature of 200° C. and FIG. 30D is a is a graph illustrating refractive index of Nitrogen and Argon gas as a function of pressure at a temperature of 300° C.

TABLE 5

Fitting parameters a and b for determining the refractive index of nitrogen and argon.

| Gas | Pressure (psi) | 27° C. | | | 300° C. | | | a | b |
|---|---|---|---|---|---|---|---|---|---|
| | | $n_3$ | N | $n_g$ | $n_3$ | N | $n_g$ | | |
| Nitrogen | 14.7 | 2.359 | 2.41618 | 1.00027 | 2.34623 | 2.43851 | 1.00014 | −0.5411 | 3.665 |
| | 100 | 2.35 | 2.42312 | 1.00184 | 1.99335 | 2.44037 | 1.00096 | −18.29 | 46.602 |
| | 200 | 2.3284 | 2.42593 | 1.00369 | 1.98377 | 2.44312 | 1.00193 | −15.88 | 40.703 |
| | 400 | 2.29255 | 2.42885 | 1.00739 | 1.9718 | 2.44729 | 1.00387 | −11.61 | 30.278 |
| Argon | 14.7 | 2.2104 | 2.41202 | 1.00025 | 2.19345 | 2.43556 | 1.00013 | −0.6876 | 3.8676 |
| | 100 | 2.20871 | 2.42020 | 1.00174 | 2.12064 | 2.43833 | 1.00091 | −4.283 | 12.552 |
| | 200 | 2.19357 | 2.42206 | 1.00348 | 2.06 | 2.44020 | 1.00182 | −5.872 | 16.360 |
| | 400 | 2.17981 | 2.4251 | 1.00696 | 1.98027 | 2.44385 | 1.00364 | −7.191 | 19.485 |

A helium-neon laser of wavelength 632.8 nm is used as a probe laser to obtain the complementary Airy pattern of the laser power reflected off a silicon carbide wafer segment at high temperatures (up to 300° C.) and pressures (up to 400 psi). The interference patterns revealed unique characteristics for nitrogen and argon test gases. This pattern is different at the same pressure and temperature for the two gases, indicating the chemical sensing capability of silicon carbide. Also the pattern changes with pressures for the same gas, indicating the pressure sensing capability. The refractive index of silicon carbide is obtained for different pressures and temperatures using the interference pattern. A three-layer model program using reflected radiation is used to calculate the refractive indices of the gases.

Optical techniques such as multibeam interference have been used for temperature measurement by interrogating a thin film of SiC (0.5-2 $\mu$m) on a single crystal sapphire, a Fabry-Pérot cavity. The temperature response of the sensor was evaluated up to 540° C. in the visible to infrared wavelength region. In this study the optical response of a silicon carbide wafer segment has been detected in the form of a complementary Airy pattern for two different gases for varying temperature and pressure. The SiC wafer segment is a Fabry-Pérot etalon. The principle of multibeam interferometry has been applied to analyze the patterns.

The reflected radiation is measured with an optical power detector connected to a power meter. A randomly polarized He—Ne laser beam is converted to the transverse magnetic (TM) mode, i.e., a parallel polarization component created by passing the beam through a polarizer. The beam splitter is specifically designed to operate at 632.8 nm wavelength. A fraction of this beam is reflected and transmitted by the sensor. The reflected beam is transmitted through the beam splitter onto a detector that measures its power.

The power of the He—Ne laser beam reflected by the silicon carbide substrate exhibited oscillatory patterns FIGS. 23 and 24, which are due to the constructive and destructive interferences of the reflected light. A portion of the incident beam is transmitted through the silicon carbide wafer segment. This beam undergoes multiple reflections between the top and bottom surfaces of the wafer segment, emerges as phase-shifted light through the top surface and interferes to produce the observed interference pattern. In FIGS. 23 and 24 the maxima represents the constructive interference effect and the minima is the destructive interference. The maxima correspond to the even multiples of the phase angle ($\delta$) and the minima correspond to the odd multiples of □. For normal incidence of the laser beam, the phase angle is given by $$\varphi = 2\pi \frac{n(\lambda, T, P)d(T, P)}{\lambda}, \quad (12)$$

where $n(\lambda,T,P)$ is the refractive index of the optical sensing device 10F, which is influenced by the wavelength ($\lambda$) due to the dispersion phenomenon, temperature (T) due to the thermo-optic effect and pressure (P) due to the stress-optics effect. $d(T,P)$ is the sample thickness which is affected by the temperature and pressure, and $\lambda$ is the wavelength of the incident light in vacuum.

FIGS. 23 and 24 represent the reflected radiation of the optical sensing device 10F when the second surface 22F is exposed to nitrogen and argon, respectively, at varying pressures. The change in temperature at a constant pressure causes the reflected radiation to oscillate between certain maximum and minimum values. These oscillations reveal an interesting pattern. Unlike the cases of atmospheric pressure shown in FIG. 23A and FIG. 24A, the oscillations tend to diverge progressively with temperature at higher pressures. The divergence patterns of the oscillations are unique to the type of gases, nitrogen and argon in this case, signifying that these patterns can be attributed to the characteristic identity of the individual gases in chemical sensing applications. The optical sensor device 10F is selective to the gas species. Another aspect of these characteristic oscillations is that the divergence pattern fans out with increasing pressure, thus enabling pressure sensing capability of the optical sensor device 10F.

Refractive Index Analytical Program for High Pressure and Temperature

The refractive index of the optical sensor device 10F can be obtained from the above-mentioned interference pattern using the following expression $$n_{m+1} = \frac{1}{1 + \frac{\alpha_{mid}\Delta T}{2}} \left[ \frac{\lambda_0}{2d(T_0, P)} + \left(1 - \frac{\alpha_{mid}\Delta T}{2}\right) n_m \right], \quad (13)$$

where $n_{m+1}$ and $n_m$ are the refractive indices of optical sensor device 10F at locations $l_{m+1}$ and $l_m$, i.e., at temperatures $T_{m+1}$ and $T_m$, respectively and at the pressure P that was applied to the wide-bandgap semiconductor substrate 20F using nitrogen or argon. In other words, $n_m$ can be written as $n_m = n(T_m, P)$ for a fixed wavelength. $\alpha_{mid}$ is the thermal expansion coefficient of wide-bandgap semiconductor substrate 20F at the temperature corresponding to the midpoint ($l_{mid}$) of the straight line $l_m l_{m+1}$. Its value for silicon carbide is given by $$\alpha = 3.19 \times 10^{-6} + 3.60 \times 10^{-9} \times T - 1.68 \times 10^{-12} \times T^2. \quad (14)$$

So $\alpha_{mid} = \alpha\left(\frac{T_m + T_{m+1}}{2}\right)$ and $\Delta T = T_{m+1} - T_m$. Knowing the refractive index ($n_0$) of SiC, which is calculated at room temperature ($T_0$) using Fresnel's formula $R = (n-1)^2/(n+1)^2$, the refractive indices can be obtained at higher temperatures from Eq. (2). While the effect of temperature on the thickness of silicon carbide is considered using the thermal expansion coefficient, the effect of pressure on the thickness is taken into account using the expression $d(T_0,P) = d_0(1-\epsilon)$, where $d(T_0,P)$ is the wafer segment thickness at room temperature ($T_0$) and pressure (P), whose values are approximately 412, 405 and 390 □m at the gas pressures of 100, 200, and 400 psi respectively, $d_0 = 420$ □m which is the original thickness of the wide-bandgap semiconductor substrate 20F.

The strain ($\epsilon$) is given by □=□/E, where σ is the applied stress and E is the elastic modulus. The value of elastic modulus has been reported as 392-694 GPa for 6H—SiC. In this study an average value of 543 GPa was used for E and the stresses were taken to be 14.7, 100, 200, and 400 psi.

FIGS. 25 and 26 illustrate the refractive index of the wide-bandgap semiconductor substrate 20F increases with applied pressure. The interface of the wide-bandgap semiconductor substrate 20F and gas (nitrogen or argon) experiences compressive stresses under high gas pressures and this produces a comparatively denser layer of wide-bandgap semiconductor substrate 20F near the second surface 22F. The refractive index of this compressed layer is higher than the refractive index of the overlying uncompressed layer. FIGS. 25 and 26 shows an increase in the refractive index with pressure.

Three-Layer Program Model for the Effect of Gas Pressure on the Refractive Index of 6H—SIC As mentioned above, the type of the gas and the pressure of the gas affect the oscillatory pattern of the reflected light. To analyze this effect, a three-layer model is considered (inset in FIG. 1) in which layer 1 is the ambient air on top of the optical sensing device 10F, layer 2 is the optical sensing device 10F itself with refractive index as determined above and layer 3 is a composite layer consisting of a few compressed atomic planes of the SiC crystal and a high pressure sheet (boundary layer) of the gas around the bottom surface of the wafer. The reflectance, R, of such a three-layer structure can be expressed as[25]

$$R = \frac{r_{12}^2 + r_{23}^2 + 2r_{12}r_{23}\cos\phi}{1 + r_{12}^2 r_{23}^2 + 2r_{12}r_{23}\cos\phi} \quad (15)$$

for a given laser beam, where $r_{12}$, and $r_{23}$ are the Fresnel reflection coefficients of layer 1-layer 2 and layer 2-layer 3 interfaces respectively. Eq. 4 can be solved for $r_{23}$, which is given by, $$r_{23} = \frac{-((1-R)r_{12}\cos\phi) \pm \sqrt{((1-R)r_{12}\cos\phi)^2 - (1-Rr_{12}^2)(r_{12}^2 - R)}}{(1 - Rr_{12}^2)}. \quad (16)$$

and then the refractive index, $n_3$, of the composite layer is obtained from the Fresnel relation expressing the refractive index in terms of the Fresnel reflection coefficient[25]

$$n_3 = n\frac{1 + r_{23}}{1 - r_{23}}. \quad (17)$$

Eq. 5 yields two values of $r_{23}$, which in turn provide two values of the refractive index $n_3$. In this study, one of the two values was found to be very close to the refractive index of SiC (e.g., 2.39) and the other value was very high (e.g., 17.44). So the actual refractive index $n_3$ was selected to be the one that was within close proximity of the refractive index of SiC.

To calculate $r_{23}$ using Eq. (6), the reflectance data (FIGS. 2 and 3) were used and $r_{12}$ was determined using Fresnel's relation $r^{12}=(n_2-1)/(n_2+1)$. The value of □ at any point on the complementary Airy pattern was obtained through linear interpolation along each arm of the pattern (e.g., straight line $l_m l_{m+1}$ in FIG. 4) and by noting that the maximum and minimum points in the pattern correspond to even and odd multiples of $\pi$ respectively. The refractive index of the composite layer ($n_3$) was obtained using Eq. 6 and its average values are shown in FIGS. 7 and 8. As mentioned before, the composite layer is formed by the SiC-gas interface (inset in FIG. 1) and therefore the optical properties of this region are expected to be different from that of the gas. Also the refractive index of this composite region may be governed by the complex interactions of the atoms of SiC and gas at high temperatures and pressures.

FIGS. 7 and 8 show that the refractive index of the composite layer decreases with temperature. This trend suggests that the gas sheet of this composite layer has a dominant effect on the refractive index ($n_3$) of the composite layer when the temperature increases. This may occur because the refractive index of gases generally decreases as the temperature increases. The decrease in the refractive index, however, is much less at atmospheric pressure than at higher pressures (100, 200 and 400 psi). This effect of the pressure is associated with the divergence patterns in FIGS. 2 and 3 where the oscillatory patterns exhibit little or no divergence at atmospheric pressure compared to the patterns at higher pressures.

Refractive Index and Analytical Program for Gases at High Pressures and Temperatures The refractive index of a gas, $n_g$, is related to its density by the following Gladstone-Dale relation $$n_g = 1 + R_{GD} \rho, \qquad (18)$$

where $R_{GD}$ is the Gladestone Dale constant and $\rho$ is the density of the gas. The values of $R_{GD}$ are 0.238 and 0.158 cm$^3$/g for nitrogen and argon respectively. Eq. (8) can be rewritten for an ideal gas as follows.

$$n_g = 1 + R_{GD} \frac{PM}{R^* T}, \qquad (19)$$

where M is the molecular weight of the gas, R* is the universal gas constant and T is the absolute temperature of the gas. The theoretical refractive indices of the two gases obtained from Eq. (8) are plotted in FIG. 9, which also contains the refractive indices determined from the experimental data. The refractive index for the gases is obtained by considering that the refractive index of the composite layer depends on the refractive indices of SiC and gas linearly as given by $$n_3 = a \times n + b \times n_g, \qquad (20)$$

where a and b are two constants which are determined by fitting the data, i.e., the values of $n_3$ and n (which are based on the experimental data) and the values of $n_g$ (which are based on the theoretical expression (9)), at two different temperatures such as the room temperature and 300° C. These values are listed in Table I for nitrogen and argon respectively for different pressures. The refractive index of the gas was found to be inversely proportional to temperature and directly proportional to the pressure of the gas as predicted by the theory. The refractive indices of nitrogen and argon are shown in FIG. 10 as a function of pressure.

The reflectance of the optical sensing device 10F exhibited unique oscillatory patterns for both nitrogen and argon at high pressures and temperatures. The oscillatory pattern tends to diverge with increase in pressure. This divergence is more prominent for argon than for nitrogen. These patterns are utilized to determine the refractive indices of SiC and the underlying gas in order to measure the pressure of the gas and to identify the type of the gas. At high pressures and temperatures, complex optothermal and optomechanical interactions occur between the gas and the compressed atomic planes of the SiC crystal, leading to the formation of a composite layer whose refractive index is different from that of the original optical sensing device 10F and the underlying gas. The refractive index of this composite layer is obtained using the reflectance data and then the refractive indices of the gases are obtained using an empirical relation involving the refractive indices of the composite layer and the optical sensing device 10F.

The present invention has several advantages over the prior art. The present invention enables in situ processing results in no thermal coefficient of expansion mismatch created when coatings are used. Annealing of the treated area is simultaneous, preventing defect generation. Te scan rate may be modeled to increase with laser intensity. The invention utilizes commercially available optics defines geometries. Doping can be selectively located by choice of laser parameters. Wide-bandgap semiconductor substrate impurities may be zone refined or evaporated during processing. Wide-bandgap semiconductor substrate defects are annealed out during processing. The laser-converted phases are stable at high temperatures (950 C and above). The converted phases can be are embedded improving chemical stability. A polished single crystalline silicon carbide substrate or epitaxial surface shows sufficient chemical stability in oxygen up to 1000° C. Laser conversion technology reduces process steps and reduces lattice and surface defect generation during processing. Optical and electrical phases are created by the same process.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. An optical device, comprising:
   a wide-bandgap semiconductor substrate having a first optical property;
   an optical device defined within said wide-bandgap semiconductor substrate having a second optical property different from said first optical property;
   said optical device being defined by a plurality of optical surfaces; and
   all of said plurality of optical surface being internal to said wide-bandgap semiconductor substrate.

2. An optical device as set forth in claim 1, wherein said optical device is an optical lens.

3. An optical device as set forth in claim 1, wherein said optical device is an optical wave guide.

4. An optical device as set forth in claim 1, wherein said optical device is an optical concentrator.

5. An optical device as set forth in claim 1, wherein said optical device is a thermal sensor.

6. An optical device as set forth in claim 1, wherein said optical device is a pressure sensor.

7. An optical device as set forth in claim 1, wherein said optical device is a chemical sensor.

8. An electro-optical device, comprising;
a wide-bandgap semiconductor substrate having a first optical property;
an optical device defined within the wide-bandgap semiconductor substrate having a second optical property different from first said optical property;
said optical device defined by a plurality of optical surfaces with all of said plurality of surfaces being internal to said wide-bandgap semiconductor substrate; and
a first and a second electrode located in proximity to said optical device for changing said second optical property upon a change of a voltage applied to said first and second electrodes.

9. An optical device, as set forth in claim 8, wherein a refractive index of said optical device is variable in accordance with a voltage applied to said first and second electrodes.

10. An optical device, comprising:
a wide-bandgap semiconductor substrate having a first optical property;
an optical device defined within said wide-bandgap semiconductor substrate having a second optical property different from said first optical property;
said optical device being defined by a plurality of optical surfaces;
all of said plurality of optical surface being internal to said wide-bandgap semiconductor substrate; and
one of said plurality of optical surface internal to said wide-bandgap semiconductor substrate being curved.

* * * * *